US011342517B2

(12) United States Patent
Wei et al.

(10) Patent No.: US 11,342,517 B2
(45) Date of Patent: May 24, 2022

(54) DIBENZOHETEROCYCLIC COMPOUND AND PREPARATION METHOD AND APPLICATION THEREOF

(71) Applicant: NINGBO LUMILAN ADVANCED MATERIALS CO., LTD., Ningbo (CN)

(72) Inventors: Ting-Wei Wei, Ningbo (CN); Kunshan Xie, Ningbo (CN); Zhi-Kuan Chen, Ningbo (CN)

(73) Assignee: Ningbo Lumilan Advanced Materials Co., Ltd., Ningbo (CN)

( * ) Notice: Subject to any disclaimer, the term of this patent is extended or adjusted under 35 U.S.C. 154(b) by 457 days.

(21) Appl. No.: 16/431,761

(22) Filed: Jun. 5, 2019

(65) Prior Publication Data
US 2020/0212321 A1 Jul. 2, 2020

(30) Foreign Application Priority Data

Dec. 29, 2018 (CN) .......................... 201811643571.1

(51) Int. Cl.
| | | |
|---|---|---|
| H01L 51/00 | (2006.01) | |
| C07F 7/08 | (2006.01) | |
| C07F 7/18 | (2006.01) | |
| C09K 11/06 | (2006.01) | |
| H01L 51/50 | (2006.01) | |

(52) U.S. Cl.
CPC .......... *H01L 51/0094* (2013.01); *C07F 7/081* (2013.01); *C07F 7/1804* (2013.01); *C09K 11/06* (2013.01); *C09K 2211/1014* (2013.01); *H01L 51/5004* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2251/552* (2013.01)

(58) Field of Classification Search
CPC ............. H01L 51/0094; H01L 51/5004; H01L 51/5012; H01L 51/5056; H01L 51/5072; H01L 51/5088; H01L 51/5092; H01L 2251/552; H01L 51/0037; H01L 51/0059; H01L 51/006; H01L 51/0061; H01L 51/0067; H01L 51/007; H01L 51/0072; C07F 7/081; C07F 7/1804; C07F 7/0816; C07F 7/0807; C07F 7/0898; C09K 11/06; C09K 2211/1014; C09K 2211/1007; C09K 2211/1029; C09K 2211/1044; C09K 2211/1048; C09K 2211/1059; C09K 2211/1096
USPC .................................................... 428/32.69
See application file for complete search history.

(56) References Cited

U.S. PATENT DOCUMENTS

| | | |
|---|---|---|
| 2018/0114929 A1 | 4/2018 | Kwong et al. |
| 2018/0366647 A1 | 12/2018 | Jun et al. |
| 2020/0385412 A1* | 12/2020 | Wei ..................... H01L 51/0094 |

FOREIGN PATENT DOCUMENTS

| | | |
|---|---|---|
| CN | 108084221 A | 5/2018 |
| CN | 109096125 A | 12/2018 |
| CN | 109651423 A | 4/2019 |
| JP | 2010202626 A | 9/2010 |

OTHER PUBLICATIONS

CAS reg. No. 2324129-39-5, Jun. 4, 2019. (Year: 2019).*
Translation of JP 2010/202616, Sep. 16, 2010. (Year: 2010).*
C.W. Tang et al., "Organic Electroluminescent Diodes," Applied Physics Letters, 51, pp. 913-915, Sep. 21, 1987.
M.A. Baldo et al., "Excitonic Singlet-Triplet Ration in a Semiconducting Organic Thin Film," Physical Review B, vol. 60, No. 20, pp. 14 422-14 428, Nov. 15, 1999.
Hiroki Uoyama, et al., "Highly Efficient Organic Light-Emitting Diodes from Delayed Fluorescence," Nature, vol. 492, pp. 234-240, Dec. 13, 2012.
Second Office Action CN Application No. 2018116435711, issued in corresponding application dated May 22, 2020.
International Search Report and Written Opinion issued in corresponding PCT/CN2019/083653 dated Oct. 11, 2019.
Takanori et al., 'Synthesis of Dibenzoheteropines of Group 13-16 Elements via Ring-Closing Metathesis', Journal of Organic Chemistry, vol. 78, Mar. 7, 2013, pp. 3329-3335.
Takanori et al., 'Ir-Catalyzed Synthesis of Substituted Tribenzosilepins by Dehydrogenative C—H/Si—H Coupling', Journal of Organic Chemistry, vol. 83, Mar. 19, 2018, pp. 3426-3432.
Sipe et al., 'Electron Spin Resonance Studies of Radical Anions of Group IV dibenzo[b,f]metallpins', Journal of Organometallic Chemistry, vol. 120, No. 2, 31, Dec. 31, 1976, pp. 195-210.

(Continued)

*Primary Examiner* — Douglas J McGinty
(74) *Attorney, Agent, or Firm* — Miles & Stockbridge P.C.; Ajay A. Jagtiani

(57) ABSTRACT

A dibenzoheterocyclic compound having a structure shown in a formula wherein the dibenzoheterocyclic compound has a low LUMO energy level and can be matched with an electron transport material favorable for injection and transport of electrons. The dibenzoheterocyclic compound has hole transport performance. As a light-emitting layer material, the dibenzoheterocyclic compound balances the ratio of electrons to holes in a light-emitting layer increasing the combination probability and improving the light-emitting efficiency of a device. The spatial configuration of the dibenzoheterocyclic compound avoids stacking of material molecules, avoiding generation of high energy excitons due to energy transfer among molecules, reducing annihilation of excitons, and inhibiting efficiency roll-off. The dibenzoheterocyclic compound has thermal stability, so blue light can be emitted efficiently and stably. An organic light-emitting diode contains the dibenzoheterocyclic compound, and a blue light-emitting device with high blue light-emitting efficiency and low driving voltage.

8 Claims, 2 Drawing Sheets

(56) References Cited

OTHER PUBLICATIONS

George et al. 'Continued Search for Elusive Persistent Trivalent Organosilyl Cations: The Claimed Trimethylsilyl Cation Revisited. Attempted Preparation of Cyclic and Halogen-Bridged Organosilicenium Ions,' Journal of the American Chemical Society, vol. 114, Dec. 31, 1992, pp. 7737-7742.
Victor et al., 'Synthesis and biological evaluation of cyclic derivatives of combretastatin A-4 containing group 14 elements', Organic & Biomolecular Chemistry, vol. 16, Jul. 30, 2018, pp. 5859-5870.
First Office Action CN Application No. 2018116435711, issued in corresponding application dated Nov. 27, 2019.
L.G. Mercier et al., "Design, Synthesis, and Characterization of Functionalized Silepins: High Quantum Yield Blue Emitters," Organometallics, vol. 30, pp. 1719-1729, 2011.
Chemical Abstract Service, RN 2242551-28-4.
Office Action, Decision of Refusal mailed in corresponding Chinese Application No. 2018116435711 dated Aug. 25, 2020 (English translation).

\* cited by examiner

DIBENZOHETEROCYCLIC COMPOUND AND PREPARATION METHOD AND APPLICATION THEREOF

BACKGROUND

Technical Field

The invention relates to the field of organic electroluminescent materials, and particularly relates to compounds with a dibenzoheterocyclic structure, a preparation method and application thereof.

Related Art

Owing to the advantages of low driving voltage, high light-emitting efficiency, high contrast ratio, high color saturation, low energy consumption, active light emitting, wide viewing angle, and high response speed, the organic light emitting diodes (OLEDs) have attracted much interest over the past decades owing to their enormous potential application in the fields of display and illumination. In 1987, the OLED with a multi-layer structure prepared by vacuum deposition coating was reported by Tang et al. in the Kodak Company. In the OLEDs, tin indium oxide (ITO) was used as a cathode, an aromatic amine derivative and tris(8-hydroxyquinoline) aluminum were sequentially coated on the cathode by evaporation, and a magnesium-silver alloy was used as an anode, so a green light-emitting device with high brightness (1000 cd/m$^2$) was obtained. Meanwhile, by optimizing the device, a hole transport layer formed by the aromatic amine derivative was additionally arranged, the device showed higher light-emitting brightness and light-emitting efficiency, and the driving voltage was lowered to below 10 V. Since then, the research of organic electroluminescent materials has attracted the attention of scientists from all over the world and become a research hotspot in academia and industry.

Fluorescent materials are the first generation of OLED materials. However, the devices based on the materials, obtain low efficiency and only utilize 25% of singlet excitons and 75% of triplet excitons return to the ground state in the form of non-radiative deactivation due to spin-inhibition, thereby limiting the efficiency of the devices to a great extent. Until 1998, Baldo et al. firstly reported that by introducing metals such as iridium (III), platinum (II) and osmium (II) into organic small molecules to form a complex, the phosphorescent emitting materials utilize both singlet and triplet excited states for light emission and can show four times higher quantum efficiency than fluorescent emitting materials. Therefore, almost 100% internal quantum efficiency was achieved in red, green and blue phosphorescent OLEDs. In 2012, the Professor Chihaya Adachi of Kyushu University discovered a TADF material with a small singlet-triplet energy level difference ($\Delta E_{ST}$), triplet state of the TADF materials can be converted to singlet state by reverse intersystem crossing. Therefore, both singlet and triplet excited states contribute to light emission from singlet state and 100% internal quantum efficiency can be realized using the TADF materials.

At present, the development of phosphorescent materials and TADF materials ensures that red and green light-emitting materials can meet the light-emitting performance requirements of the OLEDs. However, due to a shorter wavelength of an absorption spectrum and a wide band gap between LUMO and HOMO, the blue emitting materials require more energy for radiation luminescence, thereby limiting the efficiency of the blue OLEDs. The blue emitting materials mainly include planar aromatic ring molecules with simple conjugated fragments, and the blue emitting materials have low thermal stability and easily decompose under heat during film formation and application, so the efficiency and the lifetime of the devices are influenced. Meanwhile, the planar aromatic ring molecules are mutually stacked, excimers are easily formed, and the energy of the excitons is increased to cause annihilation, so the efficiency and lifetime of the devices are reduced, and the emitting color is changed.

SUMMARY

Therefore, the invention aims to solve the technical problems and overcome the defects of the blue light-emitting materials, including poor thermal stability, excitons annihilation, low light-emitting efficiency and poor lifetime.

Therefore, the invention provides the following technical scheme:

Firstly, the invention is directed to a dibenzoheterocyclic compound having a structure as shown in the formula (I):

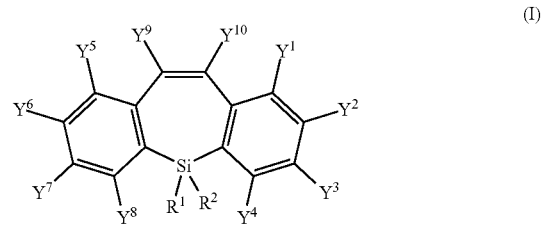

where $R^1$ and $R^2$ are, each independently, selected from hydrogen, substituted or unsubstituted $C_1$-$C_{60}$ alkyl group, substituted or unsubstituted $C_1$-$C_{60}$ alkenyl group, substituted or unsubstituted $C_1$-$C_{60}$ alkynyl group, substituted or unsubstituted $C_3$-$C_{60}$ cycloalkyl group, substituted or unsubstituted $C_3$-$C_{60}$ cycloalkenyl group, substituted or unsubstituted $C_3$-$C_{60}$ cycloalkynyl group, substituted or unsubstituted $C_1$-$C_{60}$ alkoxy group, substituted or unsubstituted $C_1$-$C_{60}$ alkenyloxy group, substituted or unsubstituted $C_1$-$C_{60}$ alkynyloxy group, substituted or unsubstituted $C_1$-$C_{60}$ alkylthio group, substituted or unsubstituted $C_1$-$C_{60}$ alkenylthio group, substituted or unsubstituted $C_1$-$C_{60}$ alkynylthio group, substituted or unsubstituted $C_1$-$C_{60}$ ester group, or substituted or unsubstituted $C_1$-$C_{60}$ amide group; $Y^1$-$Y^{10}$ are, each independently, selected from hydrogen, halogen, cyano group, substituted or unsubstituted $C_1$-$C_{60}$ alkyl group, substituted or unsubstituted $C_1$-$C_{60}$ alkenyl group, substituted or unsubstituted $C_1$-$C_{60}$ alkynyl group, substituted or unsubstituted $C_1$-$C_{60}$ alkylamino group, substituted or unsubstituted $C_1$-$C_{60}$ alkenylamino group, substituted or unsubstituted $C_1$-$C_{60}$ alkynylamino group, substituted or unsubstituted $C_1$-$C_{60}$ alkoxy group, substituted or unsubstituted $C_1$-$C_{60}$ alkenyloxy group, substituted or unsubstituted $C_1$-$C_{60}$ alkynyloxy group, substituted or unsubstituted $C_1$-$C_{60}$ thioalkoxy group, substituted or unsubstituted $C_1$-$C_{60}$ thioalkenyloxy group, substituted or unsubstituted $C_1$-$C_{60}$ thioalkynyloxy group, substituted or unsubstituted $C_1$-$C_{60}$ alkylboryl group, substituted or unsubstituted $C_1$-$C_{60}$ alkenylboryl group, substituted or unsubstituted $C_1$-$C_{60}$ alkynylboryl group, substituted or unsubstituted $C_1$-$C_{60}$ ester group, substituted or unsubstituted $C_1$-$C_{60}$ amide group, substituted or unsubstituted $C_4$-$C_{60}$ aryl group, substituted or unsubstituted $C_3$-$C_{60}$ heteroaryl group, substituted or unsubstituted $C_4$-$C_{60}$ aryloxy group, substituted or unsubstituted $C_4$-$C_{60}$ aromatic amino group, substituted or unsubstituted $C_4$-$C_{60}$ thioaryloxy group, and substituted or unsubstituted $C_4$-$C_{60}$ arylboryl group; or any two adjacent groups in $Y^1$-$Y^{10}$ are bonded to form a ring A, and the ring A is selected from three-membered to seven-membered saturated or partially unsaturated carbocyclic ring, three-membered to seven-membered saturated or partially unsaturated heterocyclic ring, $C_4$-$C_{60}$ condensed ring aryl group, $C_3$-$C_{30}$ condensed ring heteroaryl group.

Preferably, in the dibenzoheterocyclic compound, the $R^1$ and the $R^2$ are, each independently, selected from substituted or unsubstituted $C_1$-$C_{10}$ alkyl group, substituted or unsubstituted $C_1$-$C_{10}$ alkenyl group, substituted or unsubstituted $C_1$-$C_{10}$ alkynyl group, substituted or unsubstituted $C_1$-$C_{10}$ alkoxy group, and substituted or unsubstituted $C_1$-$C_{10}$ alkylthio group;

the $Y^1$-$Y^{10}$ are, each independently, selected from hydrogen, substituted or unsubstituted $C_4$-$C_{30}$ monocyclic aryl group, substituted or unsubstituted $C_3$-$C_{30}$ condensed ring aryl group, substituted or unsubstituted $C_3$-$C_{30}$ monocyclic heteroaryl group, substituted or unsubstituted $C_3$-$C_{30}$ condensed ring heteroaryl group, and substituted or unsubstituted $C_4$-$C_{30}$ aromatic amino group.

Preferably, in the dibenzoheterocyclic compound, the $Y^1$-$Y^{10}$ are, each independently, selected from hydrogen and the following substituted or unsubstituted groups:

phenyl group, biphenyl group, terphenyl group, pentalene group, indenyl group, naphthyl group, azulene group, heptalene group, adamantane group, corannulene group, triphenylene group, indacene group, acenaphthenyl group, fluorenyl group, spirobifluorene group, benzfluorene group, dibenzofluorenyl group, phenalene group, phenanthryl group, anthryl group, fluoranthene group, benzophenanthrene group, pyrenyl group, chrysenyl group, naphthacene group, picene group, perylene group, pentaphene group, pentacene group, rubicene group, coronene group, ovalene group, pyridyl group, pyrazinyl group, pyrimidinyl group, pyridazinyl group, triazinyl group, thienyl group, furanyl group, quinolyl group, carbazolyl group, pyranyl group, thiapyran group, phthalazinyl group, phenazinyl group, pyrrolyl group, pyrazolyl group, imidazolyl group, oxazolyl group, thiazolyl group, indolyl group, indolocarbazole group, phenanthridinyl group, acridinyl group, perimidine group, pteridinyl group, quinazolinyl group, quinoxalinyl group, cinnoline group, phenanthroline group, carboline group, benzofuranyl group, benzothiophene group, dibenzofuran group, dibenzothiophene group, benzonaphthofuran group, dinaphthofuran group, benzocarbazole group, dibenzocarbazole group, dibenzosilole group, benzonaphthosilole group, dinaphthosilole group, benzimidazolyl group, imidazopyridine group,

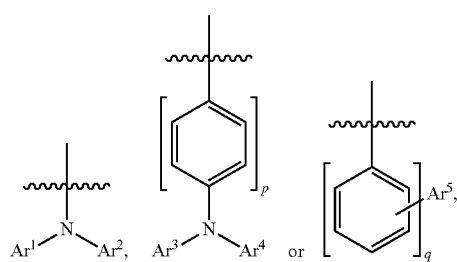

or condensed ring group, spiro ring group or chain ring group formed by the above groups, where p is an integer from 1 to 5, q is an integer from 1 to 5, and $Ar^1$-$Ar^5$ are, each independently, selected from hydrogen, $C_1$-$C_6$ alkoxy group, $C_1$-$C_6$ alkylthio group, phenyl group, biphenyl group, terphenyl group, pentalene group, indenyl group, naphthyl group, azulene group, heptalene group, adamantane group, corannulene group, triphenylene group, indacene group, acenaphthenyl group, fluorenyl group, spirobifluorene group, benzfluorene group, dibenzofluorenyl group, phenalene group, phenanthryl group, anthryl group, fluoranthene group, benzophenanthrene group, pyrenyl group, chrysenyl group, naphthacene group, picene group, perylene group, pentaphene group, pentacene group, rubicene group, coronene group, ovalene group, pyridyl group, pyrazinyl group, pyrimidinyl group, pyridazinyl group, triazinyl group, thienyl group, furanyl group, quinolyl group, carbazolyl group, pyranyl group, thiapyran group, phthalazinyl group, phenazinyl group, pyrrolyl group, pyrazolyl group, imidazolyl group, oxazolyl group, thiazolyl group, indolyl group, indolocarbazole group, phenanthridinyl group, acridinyl group, perimidine group, pteridinyl group, quinazolinyl group, quinoxalinyl group, cinnoline group, phenanthroline group, carboline group, benzofuranyl group, benzothiophene group, dibenzofuran group, dibenzothiophene group, benzonaphthofuran group, dinaphthofuran group, benzocarbazole group, dibenzocarbazole group, dibenzosilole group, benzonaphthosilole group, dinaphthosilole group, benzimidazolyl group, imidazopyridine group, or condensed ring group, spiro ring group or chain ring group formed by groups from above groups.

Preferably, in the dibenzoheterocyclic compound, the ring A is selected from at least one of a ring $A^1$ formed by $Y^9$ and $Y^{10}$, a ring $A^2$ formed by $Y^{10}$ and $Y^1$, a ring $A^3$ formed by $Y^2$ and $Y_1$, a ring $A^4$ formed by $Y^2$ and $Y^3$, a ring $A^5$ formed by $Y^4$ and $Y^3$, a ring $A^6$ formed by $Y^8$ and $Y^7$, a ring $A^7$ formed by $Y^6$ and $Y^7$, a ring $A^8$ formed by $Y^6$ and $Y^5$, and a ring $A^9$ formed by $Y^9$ and $Y^5$;

the ring $A^1$ to the ring $A^9$ are, each independently, selected from three-membered to seven-membered saturated or partially unsaturated carbocyclic ring, three-membered to seven-membered saturated or partially unsaturated heterocyclic ring, biphenyl ring, terphenyl ring, pentalene ring, indene ring, naphthalene ring, azulene ring, heptalene ring, adamantane ring, corannulene ring, triphenylene ring, indacene ring, acenaphthene ring, fluorene ring, spirobifluorene ring, benzfluorene ring, dibenzofluorene ring, phenalene ring, phenanthrene ring, anthracene ring, fluoranthene ring, benzophenanthrene ring, pyrene ring, chrysene ring, naphthacene ring, picene ring, perylene ring, pentaphene ring, pentacene ring, rubicene ring, coronene ring, ovalene ring, pyridine ring, pyrazine ring, pyrimidine ring, pyridazine ring, triazine ring, thiophene ring, furan ring, quinoline ring, carbazole ring, pyranoid ring, thiapyran ring, phthalazine ring, phenazine ring, pyrrole ring, pyrazole ring, imidazole ring, oxazole ring, thiazole ring, indole ring, indolocarbazole ring, phenanthridine ring, acridine ring, perimidine ring, pteridine ring, quinazoline ring, quinoxaline ring, cinnoline ring, phenanthroline ring, carboline ring, benzofuran ring, benzothiophene ring, dibenzofuran ring, dibenzothiophene ring, benzonaphthofuran ring, dinaphthofuran ring, benzocarbazole ring, dibenzocarbazole ring, dibenzosilole ring, benzonaphthosilole ring, dinaphthosilole ring, benzimidazole ring, imidazopyridine ring, or condensed ring, spiro ring or chain ring formed by groups from the above groups.

Preferably, the dibenzoheterocyclic compound has a structure as shown below:
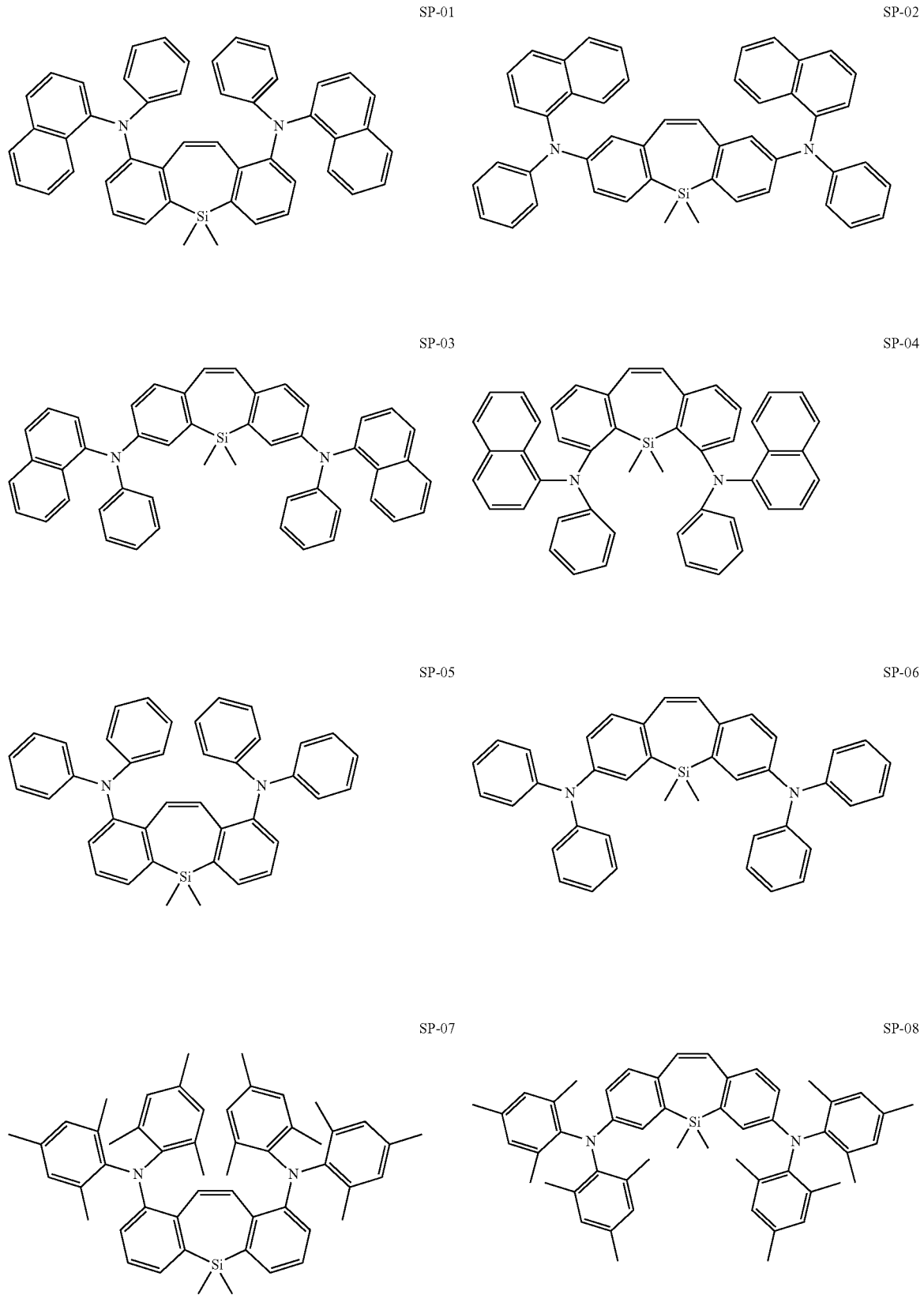

-continued
SP-09
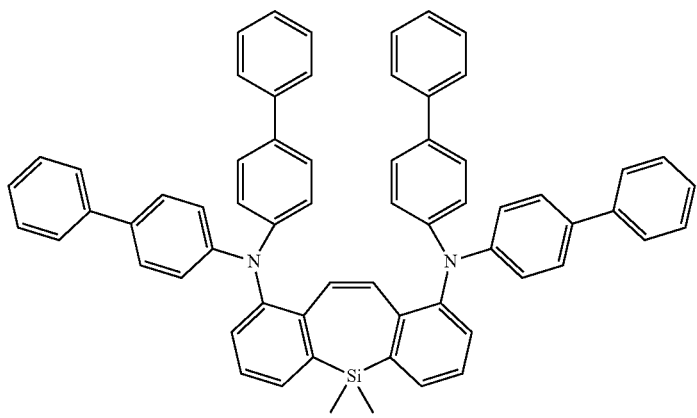
SP-10
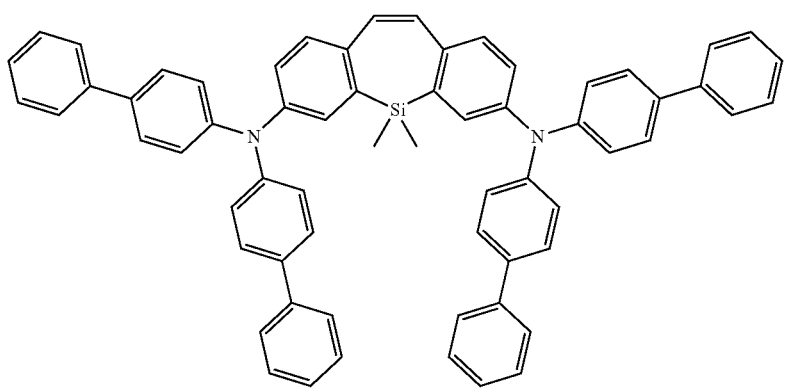
SP-11
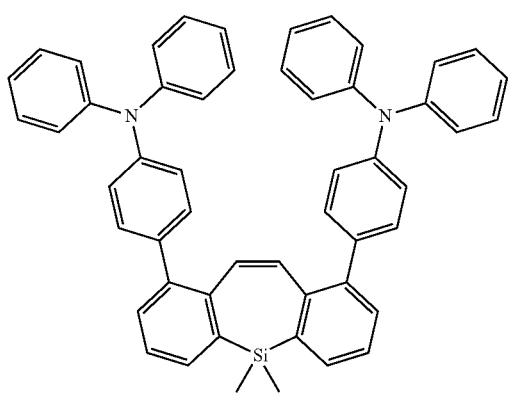
SP-12
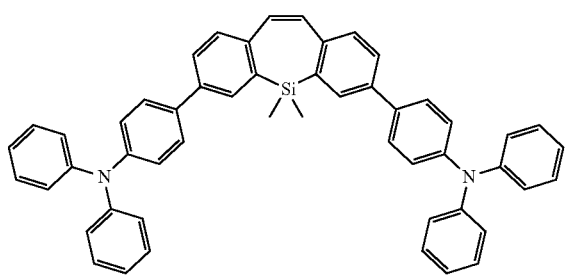
SP-13
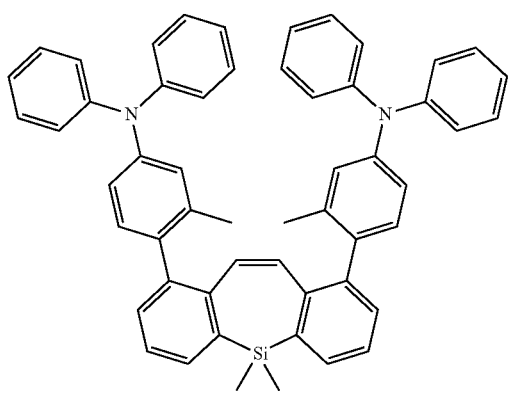
SP-14
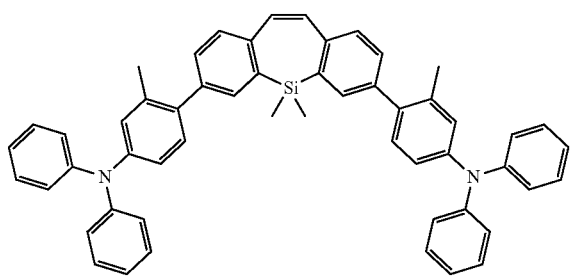

-continued
SP-15
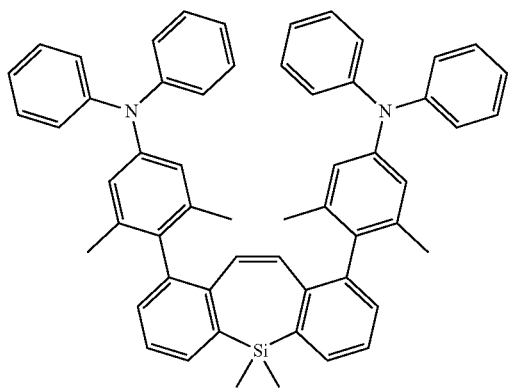
SP-16
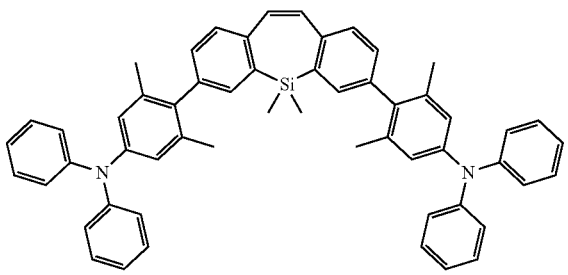
SP-17
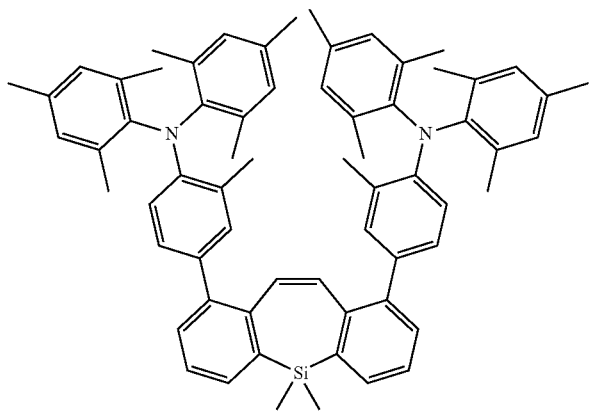
SP-18
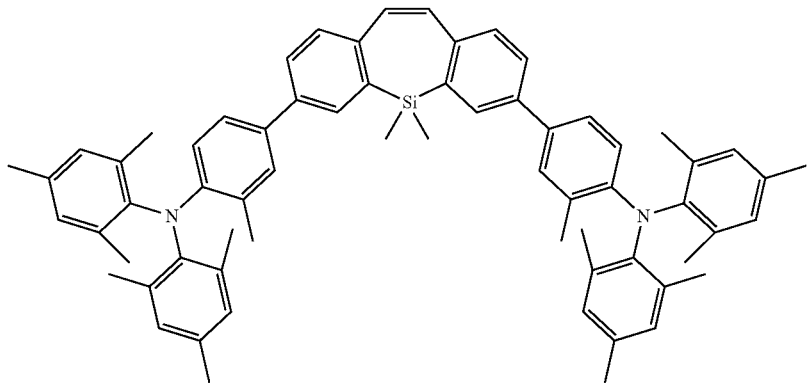
SP-19
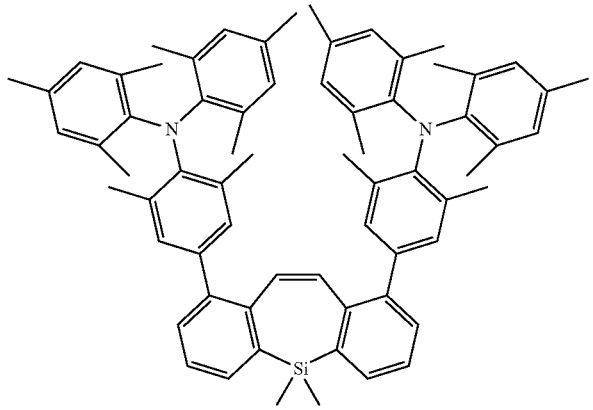

SP-20
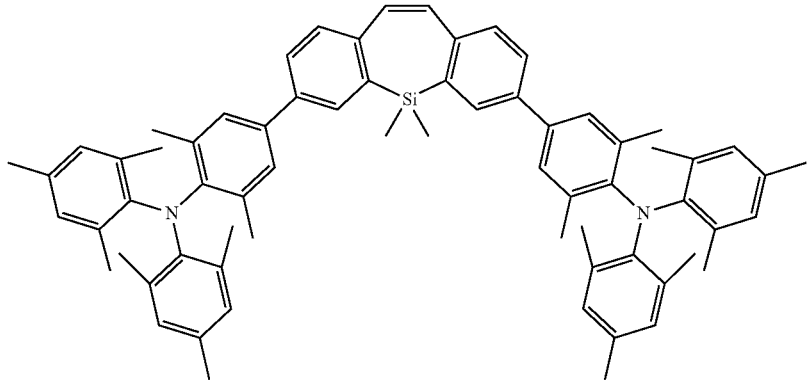
SP-21
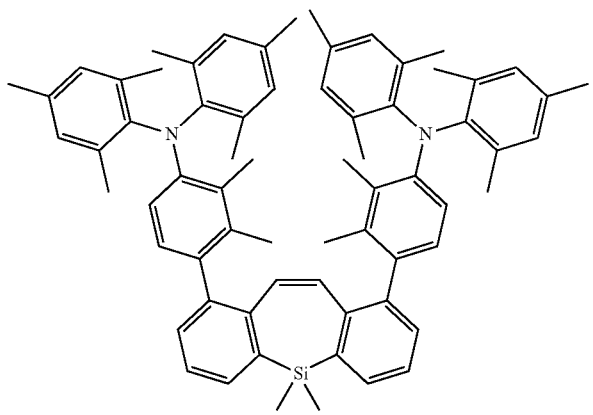
SP-22
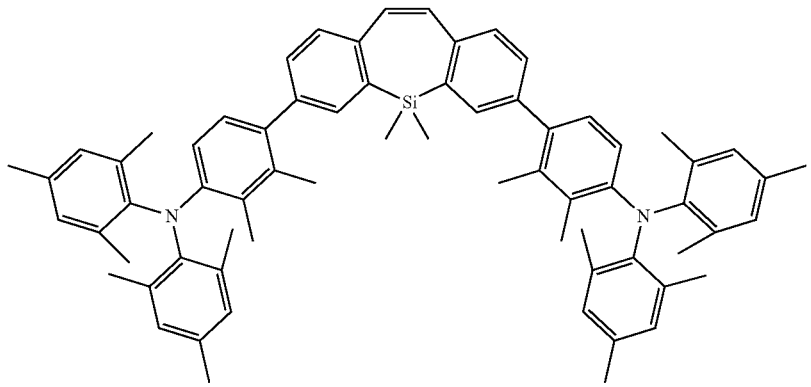
SP-23
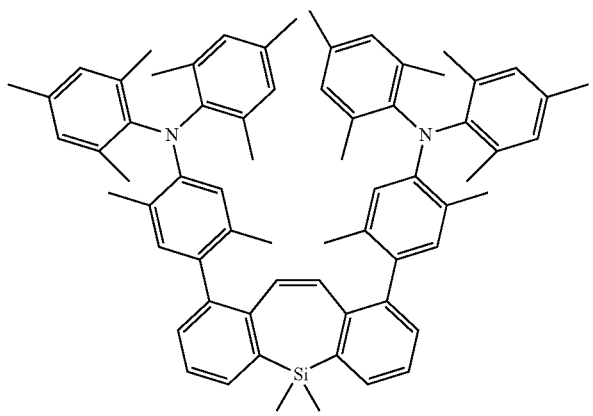

-continued
SP-24
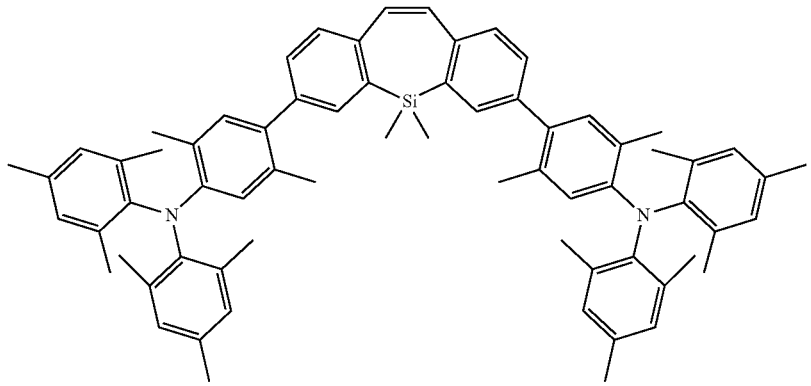
SP-25
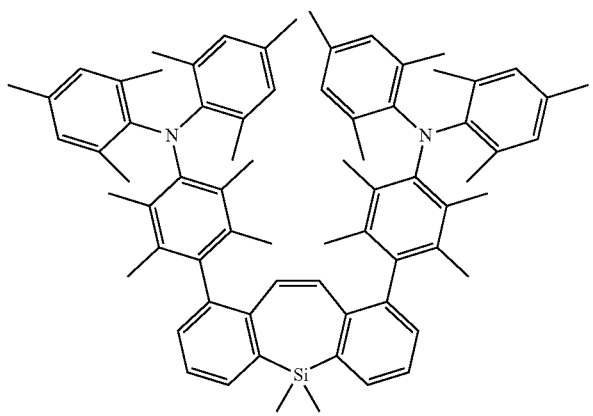
SP-26
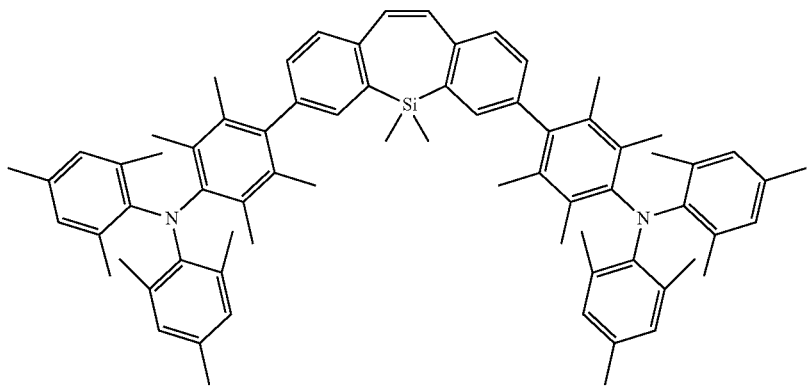
SP-27
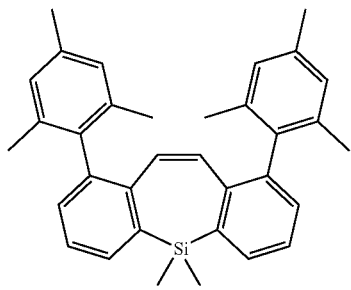
SP-28
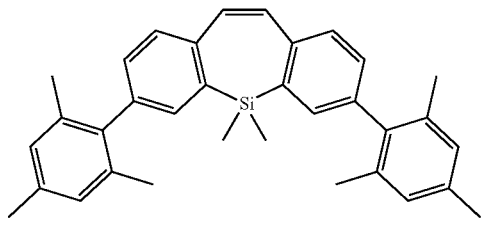

-continued
SP-29
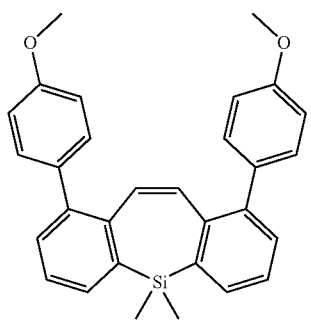
SP-30
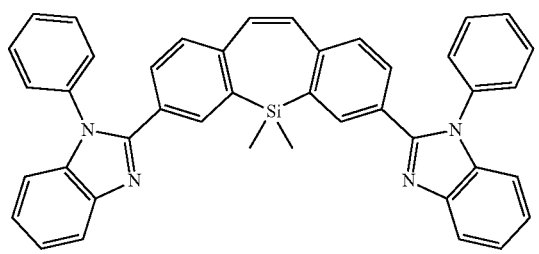
SP-31
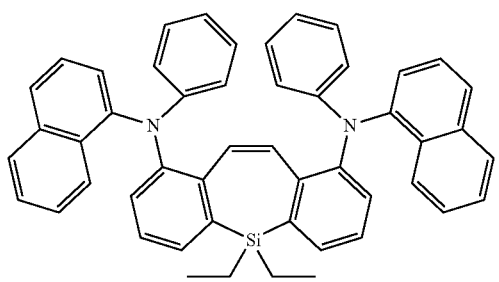
SP-32
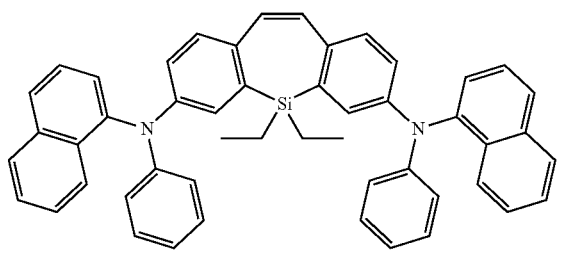
SP-33
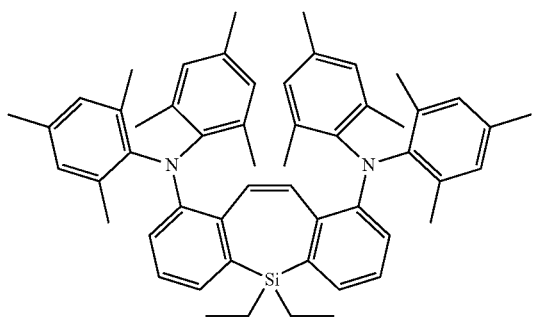
SP-34
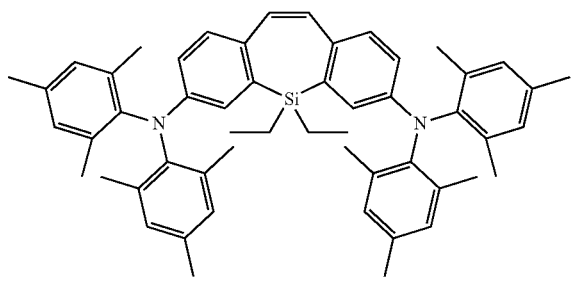
SP-35
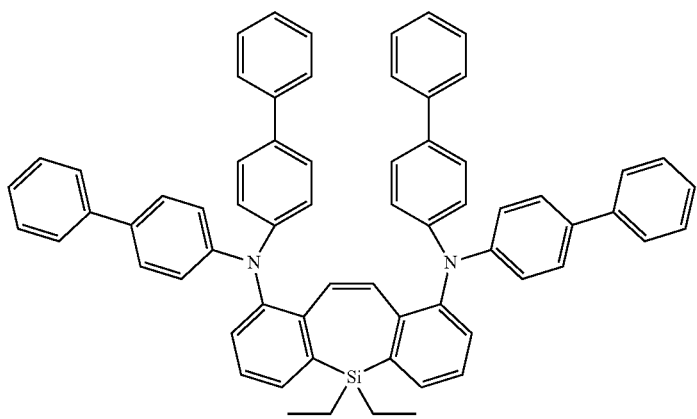

-continued
SP-36
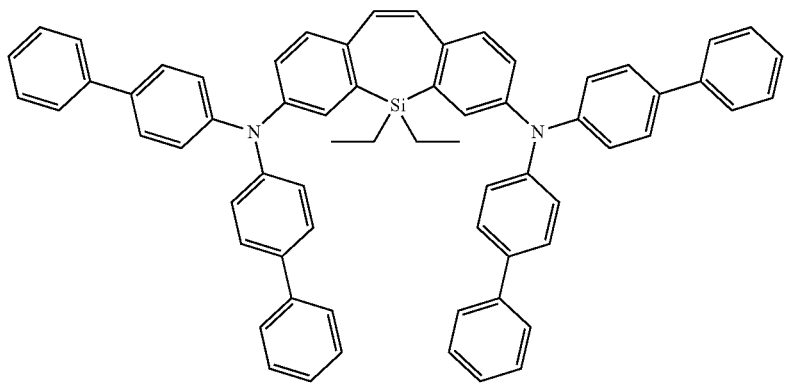
SP-37
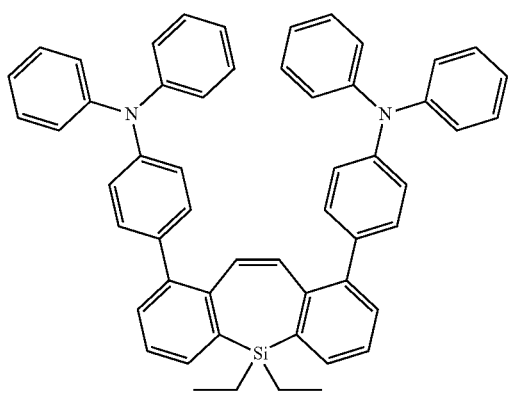
SP-38
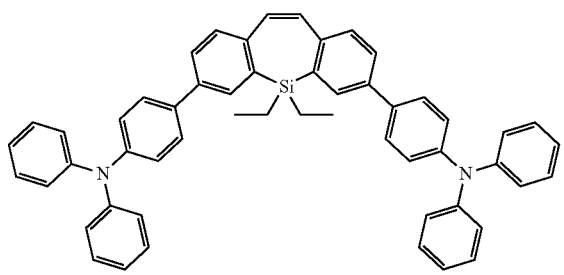
SP-39
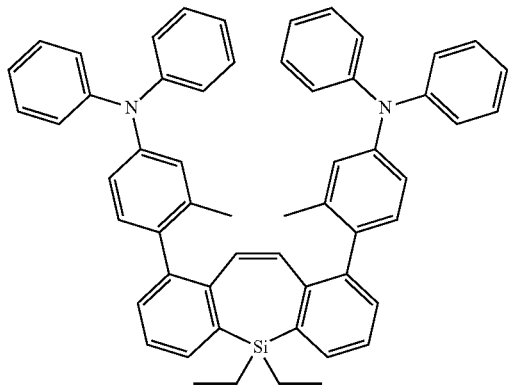
SP-40
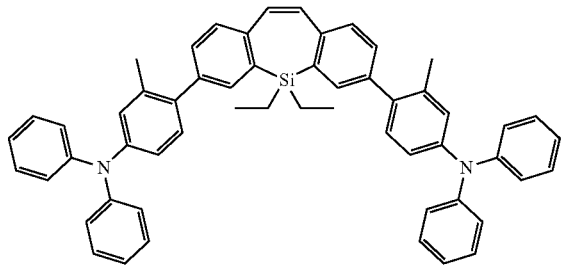
SP-41
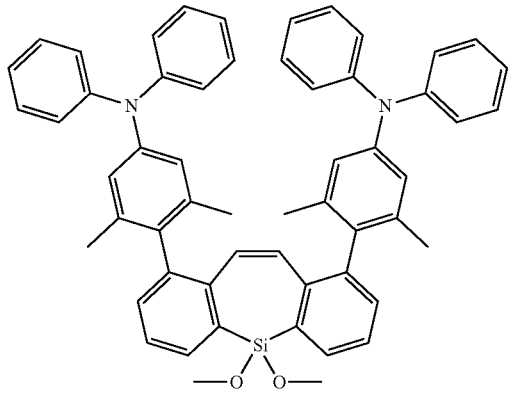
SP-42
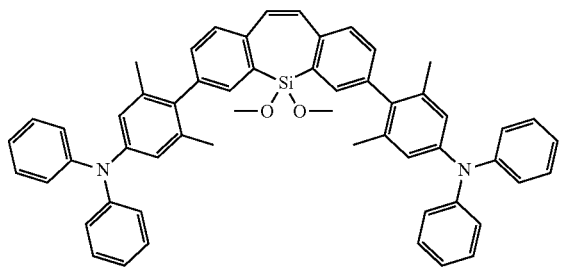

-continued
SP-43
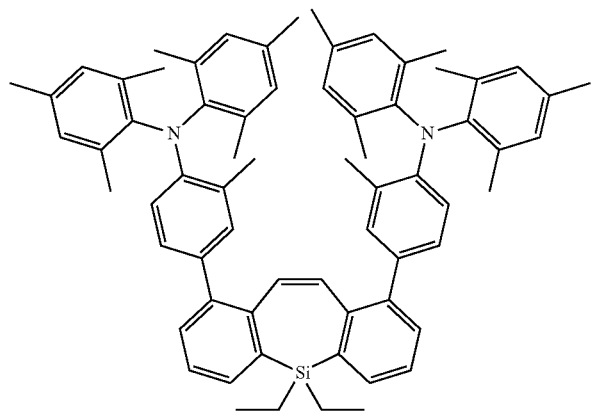
SP-44
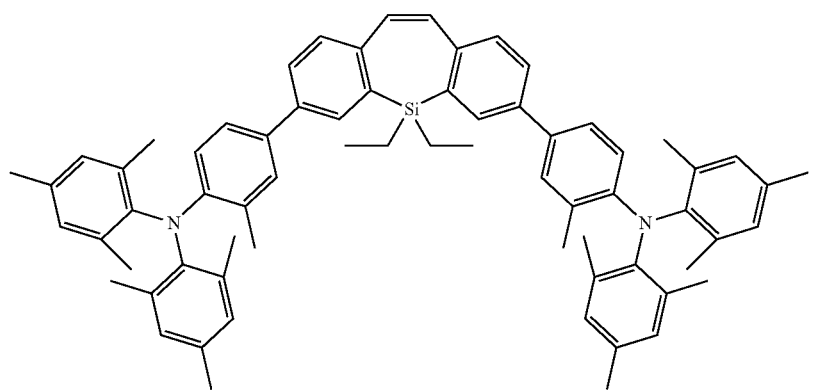
SP-45
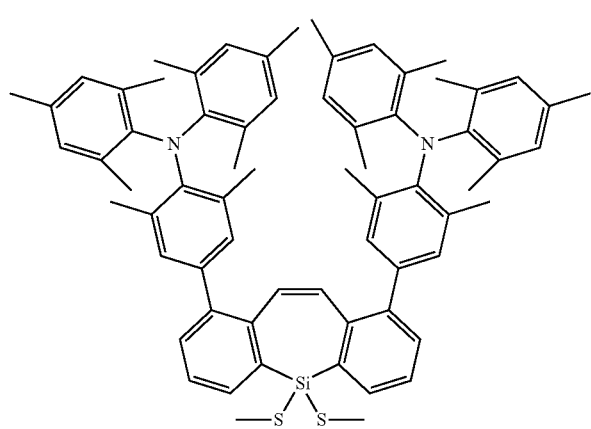

-continued
SP-46
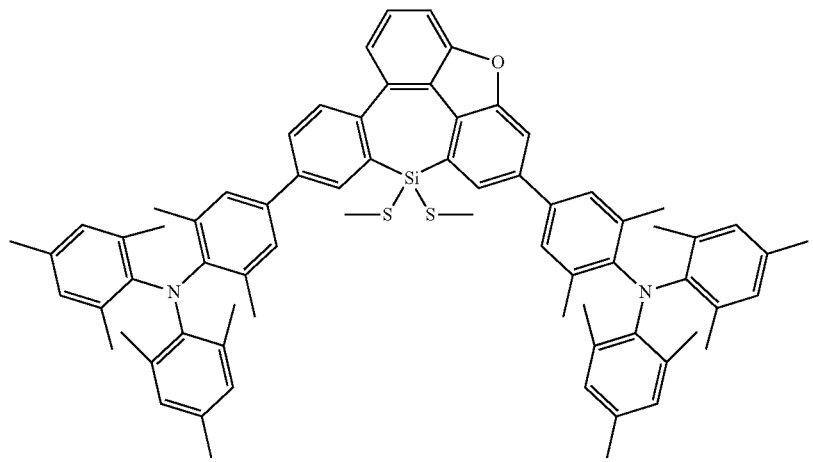
SP-47
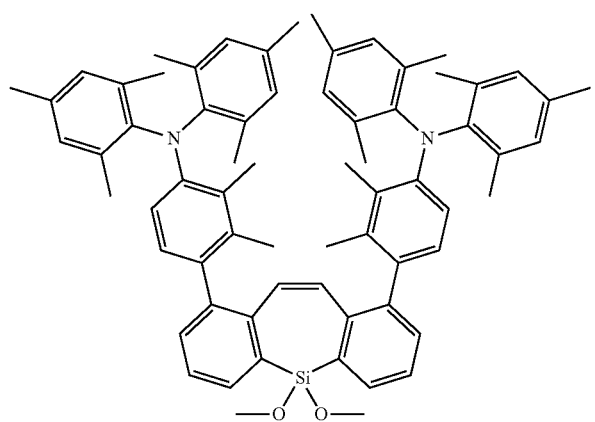
SP-48
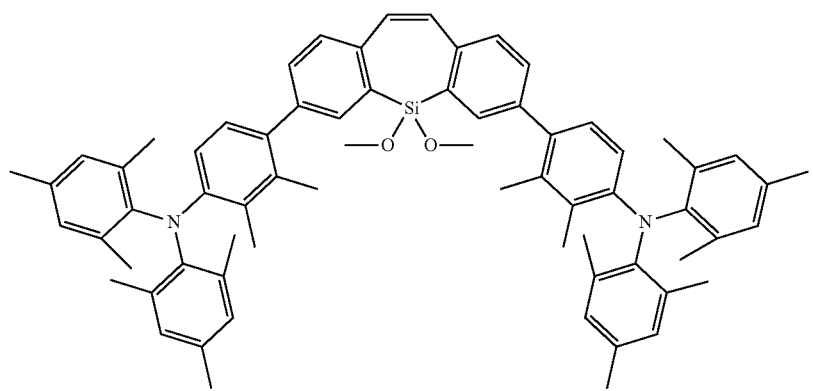

-continued
SP-49
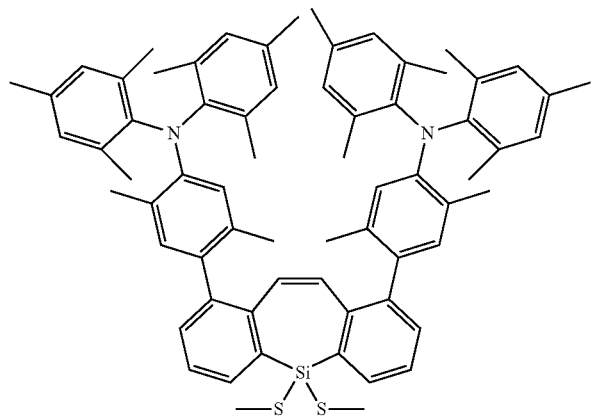
SP-50
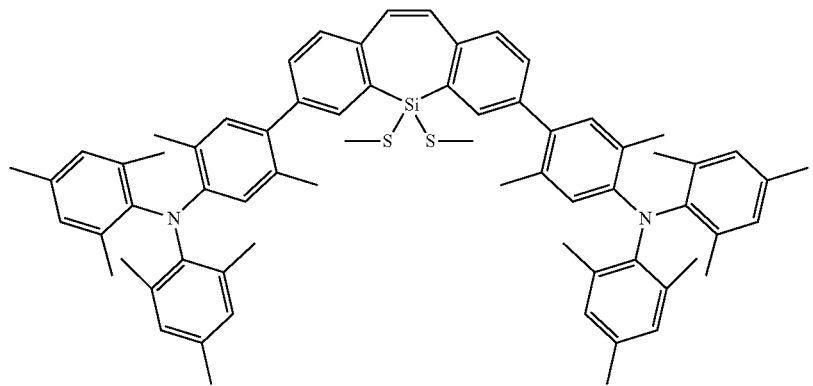
SP-51
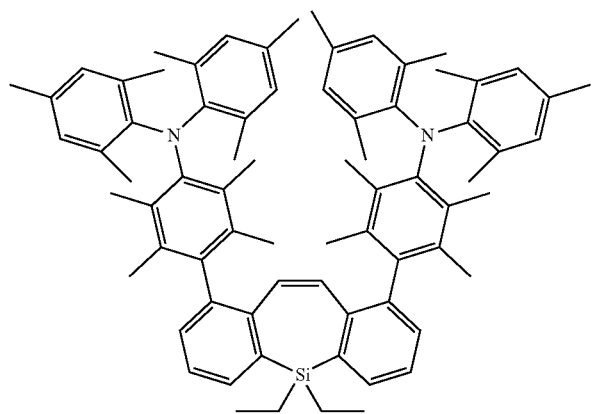
SP-52
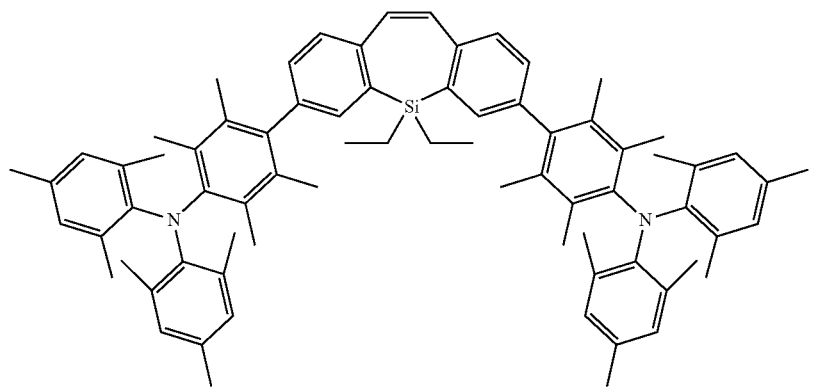

-continued
SP-53
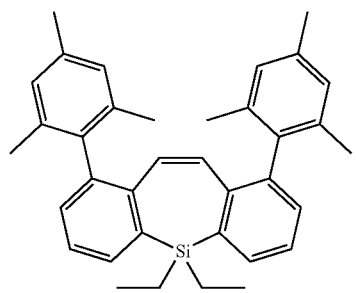
SP-54
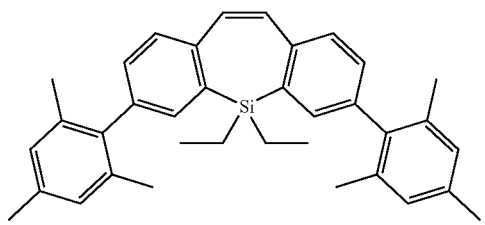
SP-55
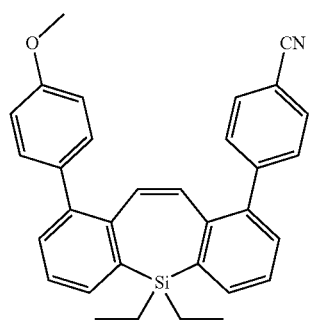
SP-56
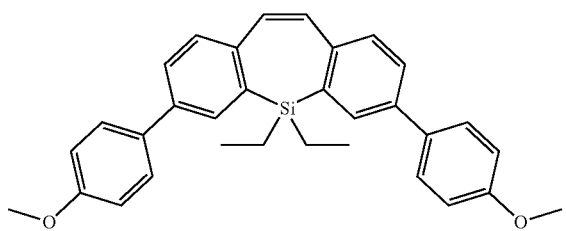
SP-57
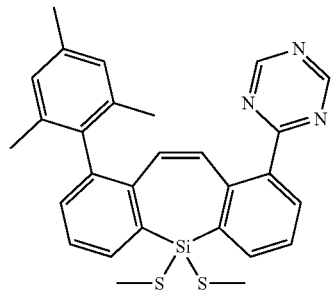
SP-58
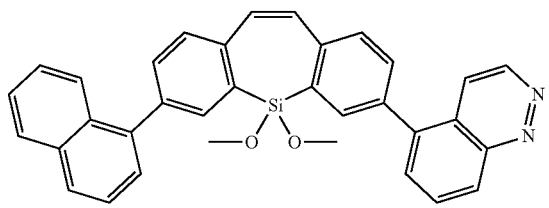
SP-59
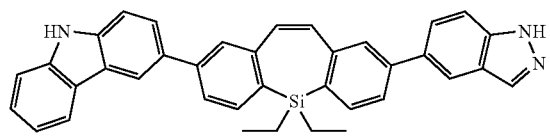
SP-60
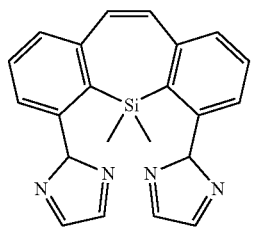
SP-61
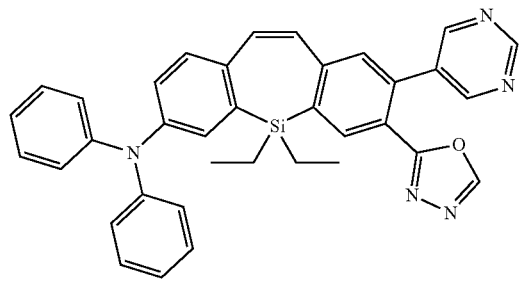
SP-62
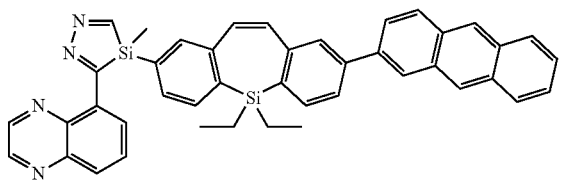

-continued

SP-63

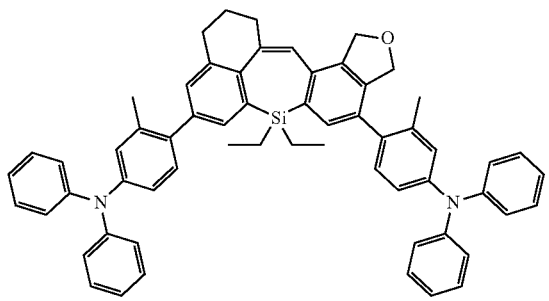

SP-64

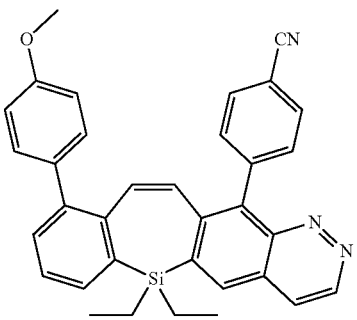

SP-65

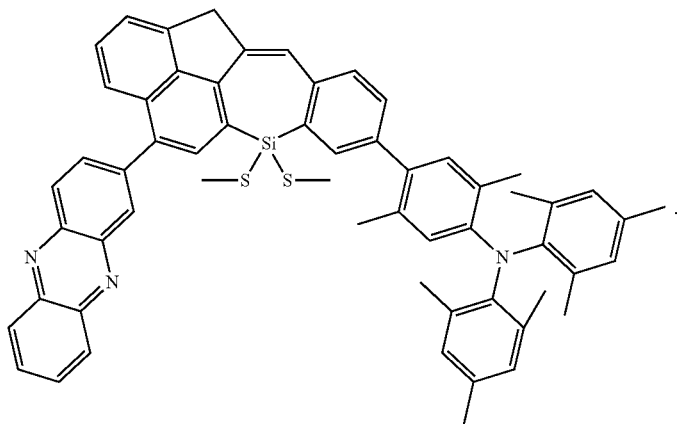

Secondly, the invention is directed to a preparation method of the dibenzoheterocyclic compound. Synthesis steps of the dibenzoheterocyclic compound shown in the formula (I) are as follows:

taking a compound shown in the formula (A) as a starting material, performing halogenating reaction under the action of a catalyst to obtain an intermediate 1, and enabling the intermediate 1 to react with triphenylphosphine to generate an intermediate 2; enabling the intermediate 2 and a compound shown in the formula (B) to be subjected to Wittig reaction to obtain an intermediate 3; enabling the intermediate 3 and a compound shown in the formula (C) to be subjected to condensation reaction to obtain an intermediate 4; enabling the intermediate 4 to react with a compound of at least one of $Y^1$-$Y^8$, a borate of at least one of $Y^1$-$Y^8$, or a cyclic compound forming any adjacent groups in $Y^1$-$Y^8$ to generate an intermediate shown in the formula (I');

when $Y^9$ and $Y^{10}$ are respectively hydrogen, determining that the intermediate shown in the formula (I') is the dibenzoheterocyclic compound shown in the formula (I); and when at least one of $Y^9$ and $Y^{10}$ is not hydrogen, enabling the intermediate shown in the formula (I') to be subjected to halogenating reaction to obtain an intermediate shown in the formula (I''), and enabling the intermediate shown in the formula (I'') to be subjected to halogenating reaction and to react with a compound of at least one of $Y^9$-$Y^{10}$ or a cyclic compound formed by $Y^9$ and $Y^{10}$ to obtain the dibenzoheterocyclic compound shown in the formula (I), where $X_1$-$X_4$ are, each independently, selected from halogen, and $R_3$-$R_{10}$ are, each independently, selected from halogen or hydrogen.

A synthesis route of the dibenzoheterocyclic compound shown in the formula (I) is as follows:

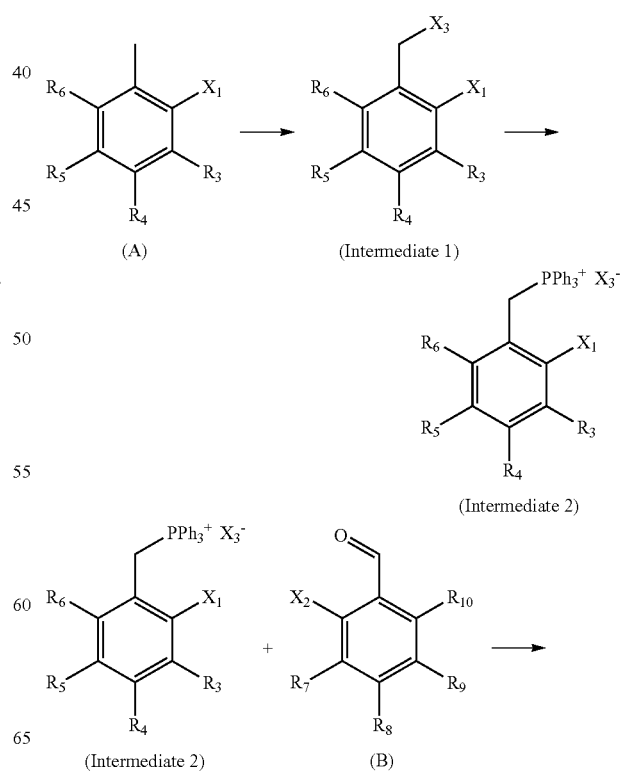

-continued

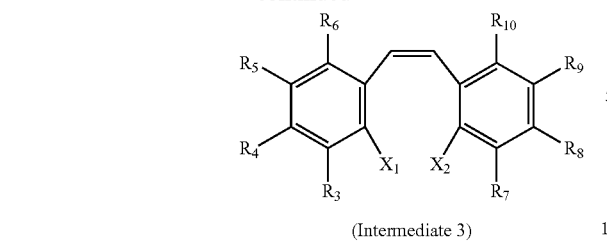

(Intermediate 3)

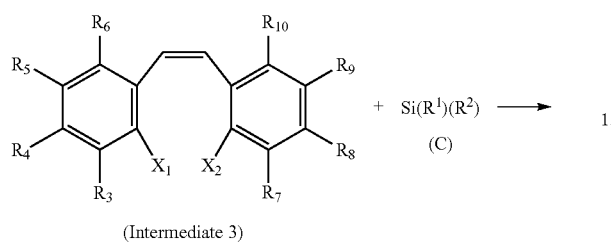

(Intermediate 3)

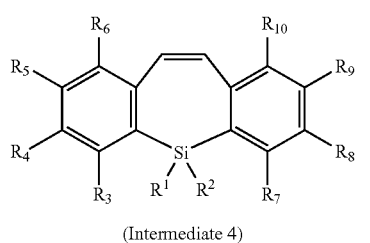

(Intermediate 4)

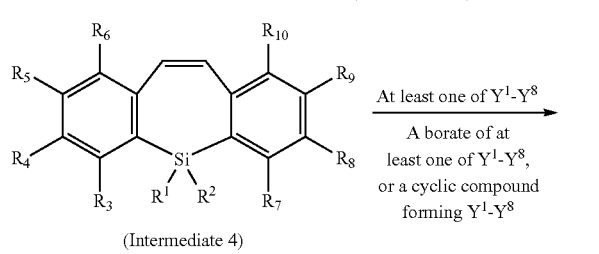

(Intermediate 4)

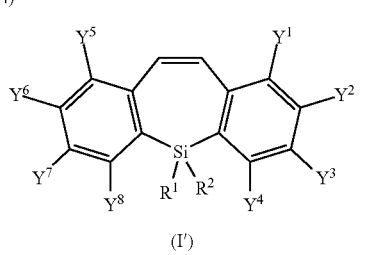

(I')

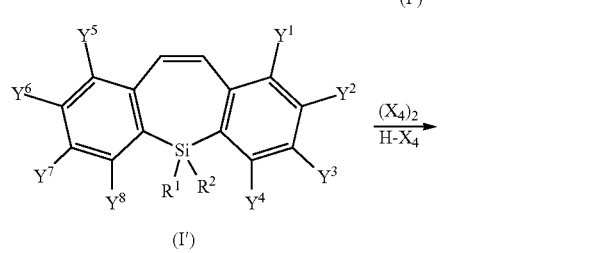

(I')

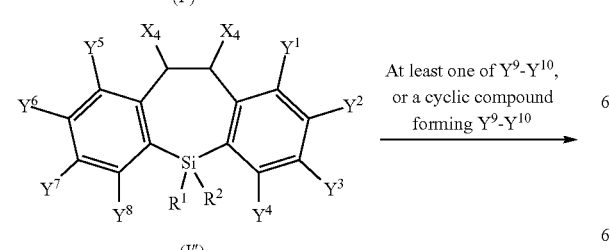

(I'')

-continued (I)

Thirdly, the invention is directed to application of the dibenzoheterocyclic compound as an organic electroluminescent material.

Fourthly, the invention is directed to application of the dibenzoheterocyclic compound in a blue light-emitting device.

Fifthly, the invention is directed to an organic light emitting diode, and at least one functional layer of the organic light emitting diode contains the dibenzoheterocyclic compound.

Preferably, in the organic light emitting diode, the functional layer is a light-emitting layer.

Further preferably, in the organic light emitting diode, a light-emitting layer material includes a host material and a guest material, and the guest light-emitting material is the dibenzoheterocyclic compound.

Sixthly, the invention is directed to a display unit, including the organic light emitting diode.

Unless otherwise stated, terms in the claims and the specification of the invention have the following meanings:

The alkyl group means fully saturated linear or branched hydrocarbyl group. For example, the alkyl group includes, but not limited to, methyl group, ethyl group, n-propyl group, isopropyl group, n-butyl group, sec-butyl group, isobutyl group, tert-butyl group, n-pentyl group, isopentyl group, neo-pentyl group, n-hexyl group, 3-methylhexyl group, 2,2-dimethylpentyl group, 2,3-dimethylpentyl group, n-heptyl group, n-octyl group, n-nonyl group, n-decyl group, and the like. The alkenyl group means linear or branched hydrocarbyl group containing at least one olefinic bond. For example, the alkenyl group includes, but not limited to, vinyl group, allyl group, and the like. The alkynyl group means linear or branched hydrocarbyl group containing at least one acetylenic bond, such as ethynyl group and propinyl group.

The alkoxy group means a group generated after linking the alkyl group with an oxygen atom. For example, the alkoxy group includes, but not limited to, methoxyl group (—$OCH_3$), ethoxyl group (—$OCH_2CH_3$), and the like. The alkenyloxy group means a group generated after linking the alkenyl group with an oxygen atom. For example, the alkenyloxy group includes, but not limited to, ethyleneoxy group (—OCH=$CH_2$), propenyloxy group (—$OCH_2CHCH_2$), and the like. The alkynyloxy group means a group generated after linking the alkynyl group with an oxygen atom. For example, the alkynyloxy group includes, but not limited to, ethynyloxy group (—OC≡CH), propynyloxy group (—$OCH_2$C≡CH), and the like. The aryloxy group means a group generated after linking the aryl group with an oxygen atom. For example, the aryloxy group includes, but not limited to,

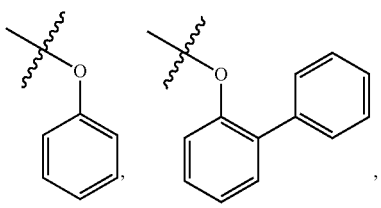 [SMILES: *Oc1ccccc1 ; *Oc1ccccc1-c1ccccc1]

and the like.

The alkylthio group means a group generated after linking the alkyl group with a sulfur atom. For example, the alkylthio group includes, but not limited to, methylthio group (—SCH$_3$), ethylthio group (—SCH$_2$CH$_3$), and the like. The alkenylthio group means a group generated after linking the alkenyl group with a sulfur atom. For example, the alkenylthio group includes, but not limited to, vinylthio group (—SCH═CH$_2$), propenylthio group (—SCH$_2$CHCH$_2$), and the like.

The alkynylthio group means a group generated after linking the alkynyl group with a sulfur atom. For example, the alkynylthio group includes, but not limited to, ethynylthio group (—SC≡CH), propynylthio group (—SCH$_2$C≡CH), and the like.

The alkylamino group means a group generated after linking the alkyl group with the amino group (—NH$_2$). For example, the alkylamino group includes, but not limited to, methylamino group (—NHCH$_3$), ethylamino group (—NHCH$_2$CH$_3$), and the like. The alkenylamino group means a group generated after linking the alkenyl group with the amino group. For example, the alkenylamino group includes, but not limited to, vinylamino group (—NHCH═CH$_2$), propenylamino group (—NHCH$_2$CHCH$_2$), and the like. The alkynylamino group means a group generated after linking the alkynyl group with the amino group. For example, the alkynylamino group includes, but not limited to, ethynylamino group (—NHC≡CH), propynylamino group (—NHCH$_2$C≡CH), and the like. The aromatic amino group means a group generated after linking the aryl group with the amino group (—NH$_2$). For example, the aromatic amino group includes, but not limited to, aniline, diphenylamine, and the like.

The technical scheme of the invention has the following advantages:

1. The dibenzoheterocyclic compound provided by the invention has the structure shown in the formula (I). The compound takes a dibenzo-seven-membered heterocyclic ring as a mother nucleus structure, and a diphenylethylene structure lowers the LUMO energy level of the dibenzoheterocyclic compound. When the dibenzoheterocyclic compound is used as a light-emitting material, the LUMO energy level of material molecules of the light-emitting layer is further matched with an adjacent electron transport layer so as to be favorable for injecting electrons into the light-emitting layer, thereby balancing the ratio of electrons to holes, increasing the combination probability of carriers, and improving the light-emitting efficiency of a device. Meanwhile, the dibenzoheterocyclic compound having the structure shown in the formula (I) has the HOMO energy level matched with the hole transport layer. The dibenzoheterocyclic compound has good hole transport performance, thereby being favorable for injection and transport of holes, further balancing injection and transport of carriers, avoiding combination of holes and electrons in regions close to electrodes, and further avoiding annihilation of excitons. The HOMO and LUMO energy levels of the dibenzoheterocyclic compound are matched with the hole transport layer and the electron transport layer, thereby lowering the potential barrier needing to be overcome by transporting electrons and holes to the light-emitting layer, and further lowering the working voltage of the device.

On the other hand, the dibenzoheterocyclic compound shows a "butterfly configuration" in spatial structure, and the spatial configuration of the dibenzoheterocyclic compound avoid molecular stacking, thereby avoiding energy transfer caused by molecular stacking, avoiding generation of high energy excitons, and effectively reducing annihilation due to the existence of high energy excitons. The dibenzoheterocyclic compound can obtain stabler excitons after combination of electrons and holes, thereby being favorable for reducing efficiency roll-off of the device due to annihilation of excitons.

The dibenzoheterocyclic compound has excellent film formation performance, and a uniform amorphous film without pinholes can be formed. The dibenzoheterocyclic compound has high thermal decomposition temperature ($T_d$) and higher thermal stability, thereby being capable of avoiding thermal decomposition of the material during film formation or use, avoiding loss of the function of the material layer, and improving the light-emitting efficiency and light-emitting performance of the device.

The dibenzoheterocyclic compound having the structure shown in the formula (I) can emit light in a blue light-emitting region. Because the dibenzoheterocyclic compound has a low LUMO energy level which can be well matched with the LUMO energy level and HOMO energy level of the electron transport layer and the hole transport layer, and has high thermal decomposition temperature and high thermal stability, stable excitons can be formed by virtue of the spatial structure of the material molecules. Therefore, the dibenzoheterocyclic compound can efficiently emit light in the blue light-emitting region, has higher light-emitting stability, and can effectively reduce color shift.

2. According to the dibenzoheterocyclic compound provided by the invention, by selecting substituent groups of $Y^1$-$Y^8$, electron withdrawing groups (pyridine, pyrimidine, triazine, pyrazine, oxadiazole, thiadiazole, quinazoline, imidazole, quinoxaline, quinoline, and the like), or electron donating groups (diphenylamine, triphenylamine, fluorene, and the like) can be further introduced into the dibenzoheterocyclic compound, the HOMO energy level of the material molecules is increased, the LUMO energy level of the material molecules is reduced, and the HOMO energy level and the LUMO energy level of the material molecules are further matched with the hole transport layer and the electron transport layer at two sides, thereby being favorable for further improving injection and transport of electrons and holes and increasing the combination probability of electrons and holes. On the other hand, the HOMO energy level is distributed in the electron donating groups, the LOMO energy level is distributed in the electron withdrawing groups, the HOMO and LOMO energy levels are relatively separated, a small singlet-triplet energy level difference ($\Delta E_{ST}$) can be obtained, triplet excitons ($T_1$) are converted to singlet excitons ($S_1$) through reverse intersystem crossing (RISC), and theoretically 100% internal quantum efficiency is achieved by singlet exciton luminescence. By adjusting the substituent groups, the dibenzoheterocyclic compound with thermal activation-delayed fluorescence performance can be obtained, and blue light with high light-emitting efficiency and light-emitting stability can be emitted.

3. The preparation method of the dibenzoheterocyclic compound provided by the invention has the advantages that the starting material is easy to obtain, the reaction conditions are mild, and the operation steps are simple. The preparation method which is simple and easy to realize is provided for large-scale production of the dibenzoheterocyclic compound.

4. At least one functional layer of the organic light emitting diode provided by the invention contains the dibenzoheterocyclic compound. Preferably where the functional layer is a light-emitting layer.

When the dibenzoheterocyclic compound is used as the light-emitting layer material, the LUMO energy level of the dibenzoheterocyclic compound is low, so that the LUMO energy level can be well matched with the energy level of the electron transport layer, thereby being favorable for injection and transport of electrons. The dibenzoheterocyclic compound has good hole transport performance and is matched with the energy level of the hole transport layer, thereby being favorable for balancing injection and transport of electrons and holes, increasing the combination probability of carriers, and obtaining an OLED which is high in light-emitting efficiency and capable of emitting blue light. The spatial configuration of the dibenzoheterocyclic compound ensures that the stability of excitons in the light-emitting layer is high, and the OLED generates efficiency roll-off due to annihilation of excitons. The HOMO and LUMO energy levels of the dibenzoheterocyclic compound are matched with the hole transport layer and the electron transport layer, thereby lowering the potential barrier needing to be overcome by injecting electrons and holes to the light-emitting layer, and further lowering the working voltage of the device. Meanwhile, the dibenzoheterocyclic compound has high thermal stability and stable film formation performance, and an OLED which is high in light-emitting efficiency, long in service life, high in color stability and capable of emitting blue light can be obtained.

Further, by adjusting the substituent groups, the dibenzoheterocyclic compound with thermal activation-delayed fluorescence performance can be obtained, triplet excitons are up-converted to singlet excitons, the blue light-emitting device can further emit light efficiently by singlet exciton luminescence, and the problem of low light-emitting efficiency of an OLED capable of emitting blue light due to high blue light energy is solved.

In addition, when the dibenzoheterocyclic compound has both electron withdrawing groups and electron donating groups, the dibenzoheterocyclic compound can also be used as the host material of the light-emitting layer to enable the host material to have bipolarity and narrower energy gap, thereby being favorable for combination of electrons and holes on the host material, increasing a combination region, lowering the concentration of excitons, effectively reducing the annihilation of excitons, and solving the problems of low efficiency and short service life due to the annihilation of excitons. In addition, compared with the traditional host material, when the dibenzoheterocyclic compound is used as the host material, the high rate of reverse intersystem crossing (RISC) for conversion from $T_1$ to $S_1$ can inhibit Dexter energy transfer (DET) from the host material to a guest light-emitting dye, promote FÖrster energy transfer, increase the ratio of singlet excitons and simultaneously inhibit triplet excitons, thereby greatly reducing the exciton loss during Dexter energy transfer (DET), effectively reducing the efficiency roll-off of the OLED, and increasing the external quantum efficiency of the device.

BRIEF DESCRIPTION OF THE DRAWINGS

In order to more clearly illustrate the technical schemes in the detailed description of the invention or the existing technologies, the drawings required in the detailed description of the specific embodiments or the description of the prior art are simply described below. Obviously, the drawings in the following description are some embodiments of the invention, and a person of ordinary skill in the art can also obtain other drawings according to these drawings without any creative work.

REFERENCE NUMERALS IN THE DRAWINGS

Figure 1:
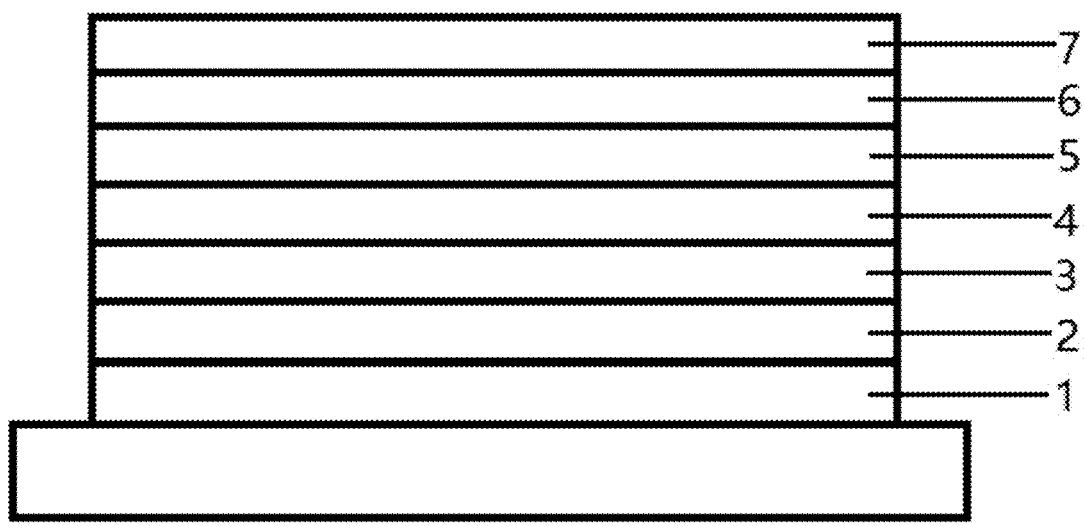
FIG. 1 is a structural schematic diagram of an organic light emitting diode according to embodiments 11-19 and a contrast 1 of the invention.
Figure 2:
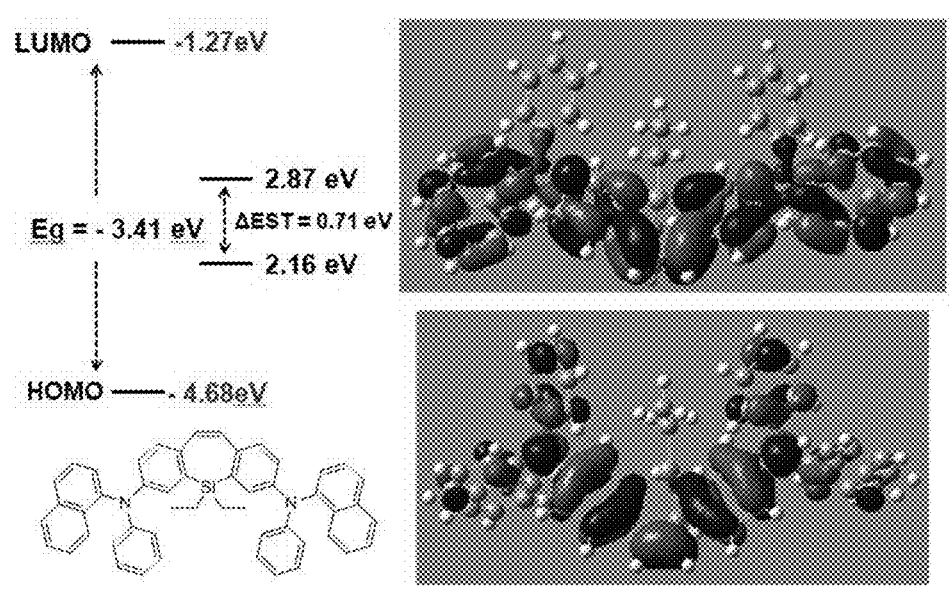
FIG. 2 is a diagram showing the HOMO energy level, the LUMO energy level and theoretical calculation results of $\Delta E_{st}$ of a compound shown in the formula SP-32 provided by an embodiment 5 of the invention.

1—anode, 2—hole injection layer, 3—hole transport layer, 4—light-emitting layer, 5—electron transport layer, 6—electron injection layer, and 7—cathode.

DETAILED DESCRIPTION

The technical schemes of the invention will be clearly and completely described below. Obviously, the described embodiments are only a part of the embodiments of the invention but not all of the embodiments. Based on the embodiments in the invention, all other embodiments obtained by a person of ordinary skill in the art without creative work belong to the scope of protection of the invention. In addition, the technical features involved in different embodiments of the invention described below can be combined with one other as long as the technical features do not conflict with one other.

In the description of the invention, it should be noted that the terms "first", "second" and "third" are used for description only and are not intended to indicate or imply relative importance.

The invention can be implemented in many different forms and should not be construed as being limited to the embodiments described herein. Instead, by providing these embodiments, the present disclosure is thorough and complete, the concept of the invention is fully delivered to those skilled in the art, and the invention is limited only by the claims. In the drawings, for clarity, the dimensions and relative dimensions of layers and regions are exaggerated. It should be understood that, when a component, such as a layer, is known as "formed on" or "arranged on" another component, this component can be directly arranged the another component, or an intermediate component can be arranged. On the contrary, when the component is known as "directly formed on" or "directly arranged on" another component, no intervening element is present.

Embodiment 1

This embodiment provides a dibenzoheterocyclic compound having a structure as shown in the formula SP-01 below:

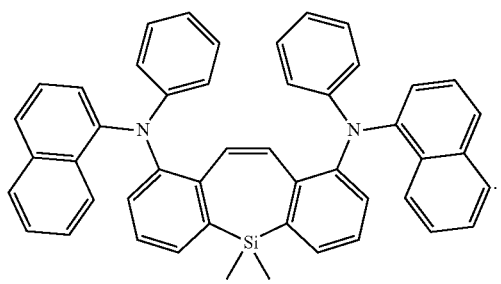

SP-01

A synthesis route of the dibenzoheterocyclic compound shown in the formula SP-01 is as shown below:

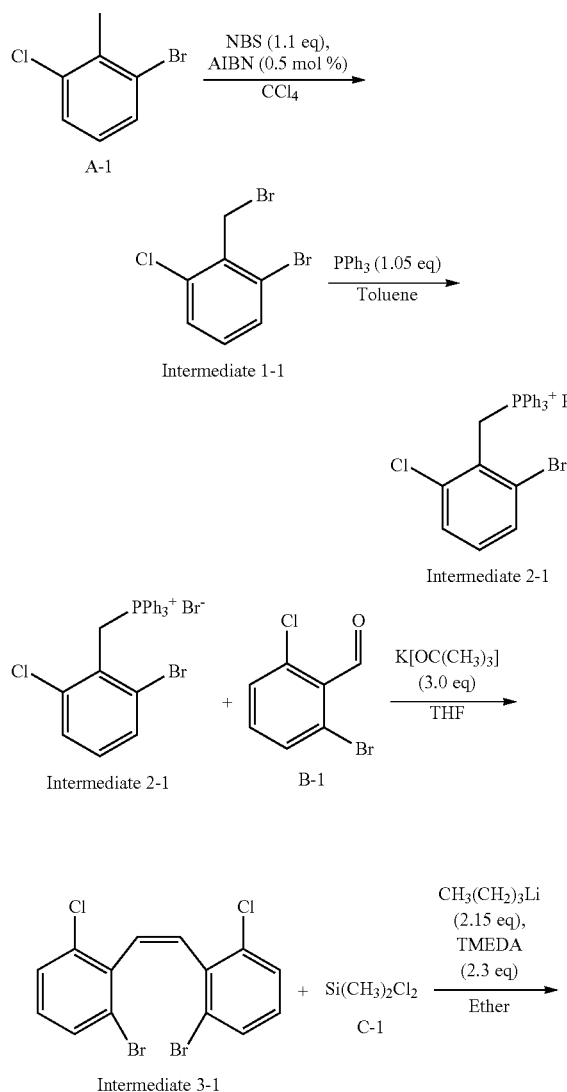

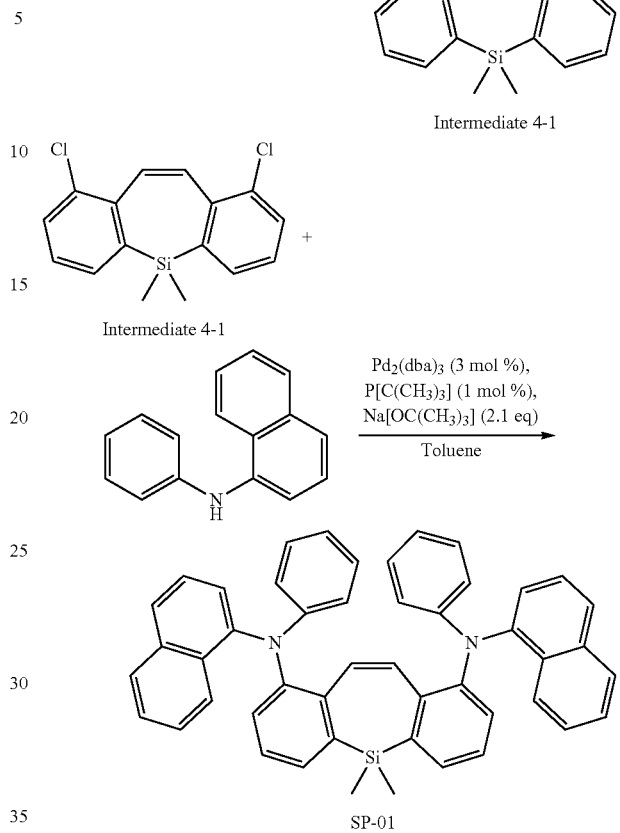

A preparation method of the dibenzoheterocyclic compound shown in the formula SP-01 includes the following steps:

1. Preparation of Intermediate 1-1

In a dry, nitrogen-flushed 500-ml double-neck round-bottom flask, equipped with a magnetic stirring bar and a reflux tube, firstly a compound A-1 (20.548 g, 1.0 equivalent), NBS (N-bromosuccinimide, 19.578 g, 1.1 equivalent), AIBN (azodiisobutyronitrile, 0.821 g, 0.5 mol percent), and carbon tetrachloride (250 ml) were respectively added, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/10) to obtain the intermediate 1-1 (21.044 g, yield: 74%).

2. Preparation of Intermediate 2-1

In a dry, nitrogen-flushed 500 ml double-neck round-bottom flask, equipped with a magnetic stirring bar and a reflux tube, firstly the intermediate 1-1 (20.000 g, 1.0 equivalent) and triphenylphosphine (19.369 g, 1.05 equivalent), and toluene (250 ml) were respectively added, the mixture was stirred for 10 minutes, and finally, the mixture was heated refluxly for 18 hours; after reaction, the mixture was filtered, and then, the obtained solid was cleaned with hexane (3*80 ml) to obtain a crude product (38.231 g) of the intermediate 2-1.

3. Preparation of Intermediate 3-1

In a dry, nitrogen-flushed 500 ml double-neck round-bottom flask, equipped with a magnetic stirring bar, firstly, the intermediate 2-1 (35.000 g, 1.0 equivalent), potassium tert-butoxide (21.553 g, 3.0 equivalent), and tetrahydrofuran (150 ml) were respectively added, the mixture was stirred for 10 minutes at 0° C., subsequently, 2-bromo-6-chlorobenzaldehyde (a compound shown in the formula B-1, 14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered and concentrated under vacuum. The crude product was purified by column chromatography (ethyl acetate/hexane, 1/75) to obtain the intermediate 3-1 (23.969 g, yield: 92%).

4. Preparation of Intermediate 4-1

In a dry, nitrogen-flushed 500-ml double-neck round-bottom flask, equipped with a magnetic stirring bar and a reflux tube, firstly, the intermediate 3-1 (20.346 g, 1.0 equivalent) and anhydrous tetrahydrofuran (180 ml) were added, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dimethyldichlorosilane (the compound shown in the formula C-1, 6.6 ml, 1.1 equivalent) was added dropwise; after reaction a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-1 (9.616 g, yield: 63%).

5. Preparation of Dibenzoheterocyclic Compound Having Structure Shown in Formula SP-01

In a dry, nitrogen-flushed 100-ml double-neck round-bottom flask, equipped with a magnetic stirring bar and a reflux tube, firstly, the intermediate 4-1 (3.053 g, 1.0 equivalent), N-(1-naphthyl)-aniline (4.495 g, 2.05 equivalent), Pd$_2$(dba)$_3$ (0.275 g, 3 mol percent), potassium tert-butoxide (2.018 g, 2.1 equivalent), and anhydrous toluene (40 ml) were respectively added, the mixture was stirred for 10 minutes, subsequently, tert-butyl phosphate dissolved in toluene (0.03 M, 10 ml) was added dropwise, and finally, the mixture was heated refluxly for 6 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-01 (6.441 g, yield: 96%).

Elemental analysis: ($C_{48}H_{38}N_2Si$) theoretical values: C, 85.93; H, 5.71; N, 4.18; Si, 4.19; measured values: C, 85.81; H, 5.74; N, 4.21; Si, 4.24; HRMS (ESI) m/z (M+): theoretical value: 670.9310; measured value: 679.9313.

Embodiment 2

This embodiment provides a dibenzoheterocyclic compound having a structure as shown in the formula SP-02 below:

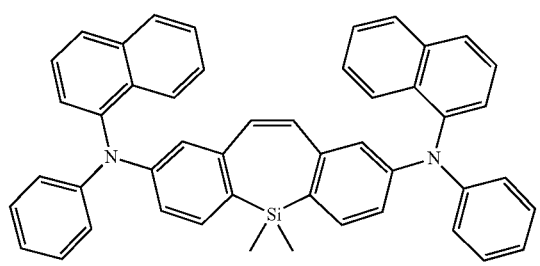

SP-02

A synthesis route of the dibenzoheterocyclic compound shown in the formula SP-02 is as shown below:

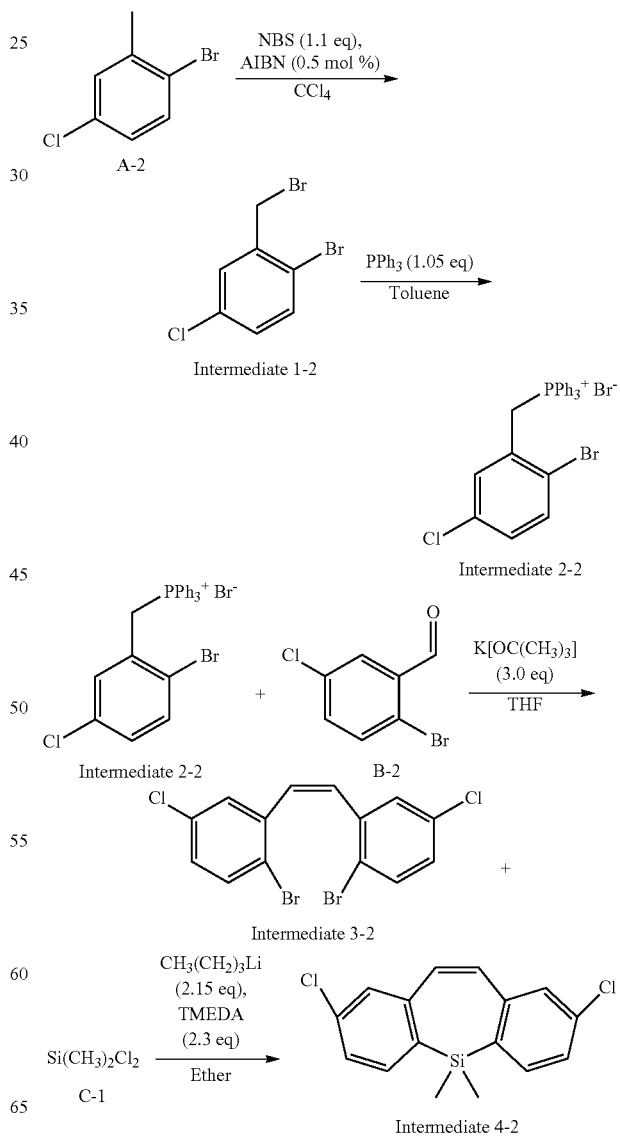

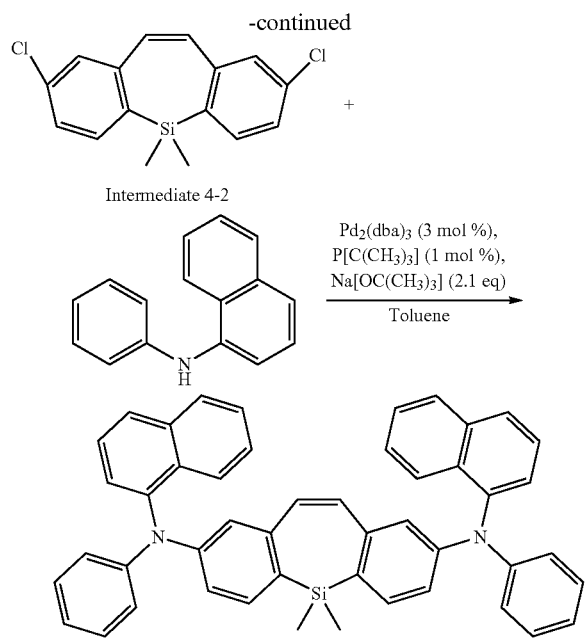

A preparation method of the dibenzoheterocyclic compound shown in the formula SP-02 includes the following steps:

1. Preparation of Intermediate 1-2

In a dry, nitrogen-flushed 500-ml double-neck round-bottom flask, equipped with a magnetic stirring bar and a reflux tube, firstly a compound A-2 (20.548 g, 1.0 equivalent), NBS (N-bromosuccinimide, 19.578 g, 1.1 equivalent), AIBN (azodiisobutyronitrile, 0.821 g, 0.5 mol percent), and carbon tetrachloride (250 ml) were respectively added, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, concentrated under vacuum. The crude product was purified by means of column chromatography (ethyl acetate/hexane, 1/10) to obtain the intermediate 1-2 (20.191 g, yield: 71%).

2. Preparation of Intermediate 2-2

In a dry, nitrogen-flushed 500-ml double-neck round-bottom flask, equipped with a magnetic stirring bar and a reflux tube, firstly, the intermediate 1-2 (20.000 g, 1.0 equivalent), triphenylphosphine (19.369 g, 1.05 equivalent), and toluene (250 ml) were respectively added, the mixture was stirred for 10 minutes, and finally, the mixture was heated refluxly for 18 hours; after reaction, the mixture was filtered, and the obtained solid was cleaned with hexane (3*80 ml) to obtain a crude product (38.466 g) of the intermediate 2-2.

3. Preparation of Intermediate 3-2

In a dry, nitrogen-flushed 500-ml double-neck round-bottom flask, equipped with a magnetic stirring bar, firstly, the intermediate 2-2 (35.000 g, 1.0 equivalent), potassium tert-butoxide (21.553 g, 3.0 equivalent), and tetrahydrofuran (150 ml) were respectively added, the reaction was stirred for 10 minutes at 0° C., subsequently, 2-bromo-5-chlorobenzaldehyde (a compound shown in the formula B-2, 14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered, concentrated under vacuum. The crude product was purified by means of column chromatography (ethyl acetate/hexane, 1/70) to obtain the intermediate 3-2 (23.187 g, yield: 89%).

4. Preparation of Intermediate 4-2

In a dry, nitrogen-flushed 500-ml double-neck round-bottom flask, equipped with a magnetic stirring bar and a reflux tube, firstly, the intermediate 3-2 (20.346 g, 1.0 equivalent) and anhydrous tetrahydrofuran (180 ml) were added, the mixture was stirred for 10 minutes at −78° C., subsequently, 2.5 M butyl lithium dissolved in hexane (43 ml, 2.15 equivalent) was added dropwise, and the reaction was stirred for 30 minutes, N,N,N',N'-tetramethyl-1,2-ethanediamine (17 ml, 2.3 equivalent) was added dropwise and the reaction was stirred for 2 hours, and finally, dimethyldichlorosilane (the compound shown in the formula C-1, 6.6 ml, 1.1 equivalent) was added dropwise; a saturated sodium bicarbonate aqueous solution (50 ml) was added to quench the reaction. After extraction with ethyl acetate (3*150 ml), the combined extraction liquids were dried over magnesium sulfate, filtered, concentrated under vacuum. The crude product was purified by means of column chromatography (ethyl acetate/hexane, 1/30) to obtain the intermediate 4-2 (7.784 g, yield: 51%).

5. Preparation of Dibenzoheterocyclic Compound Shown in Formula SP-02

In a dry, nitrogen-flushed 100-ml double-neck round-bottom flask, equipped with a magnetic stirring bar and a reflux tube, the intermediate 4-2 (3.053 g, 1.0 equivalent), N-(1-naphthyl)-aniline (4.495 g, 2.05 equivalent), Pd$_2$(dba)$_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-02 (5.166 g, yield: 77%).

Elemental analysis: ($C_{48}H_{38}N_2Si$) theoretical values: C, 85.93; H, 5.71; N, 4.18; Si, 4.19; measured values: C, 85.91; H, 5.72; N, 4.16; Si, 4.21; HRMS (ESI) m/z (M$^+$): theoretical value: 670.9310; measured value: 679.9311.

Embodiment 3

This embodiment provides a dibenzoheterocyclic compound having a structure as shown in the formula SP-03 below:

SP-03

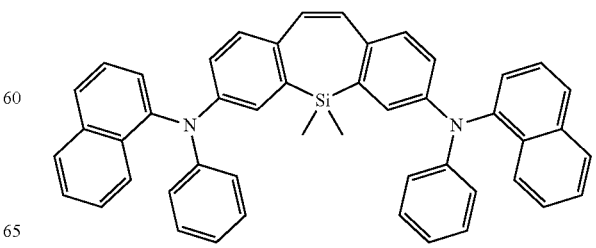

A synthesis route of the dibenzoheterocyclic compound shown in the formula SP-03 is as shown below:

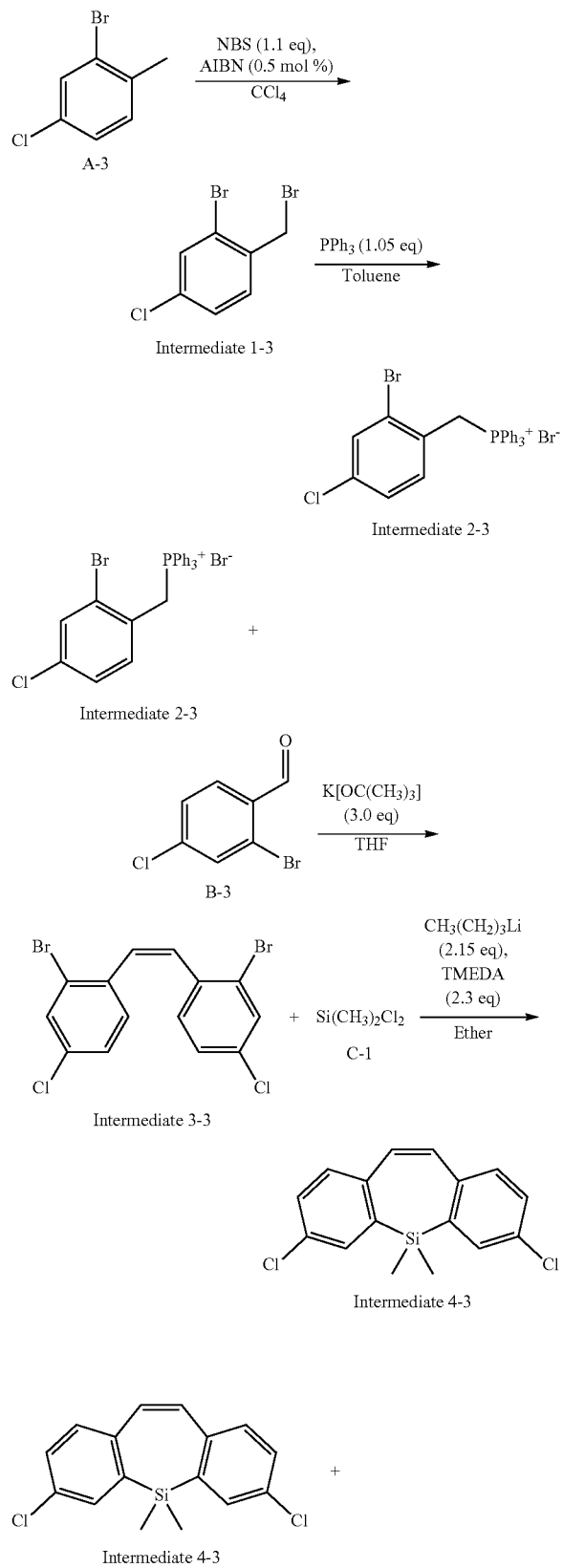

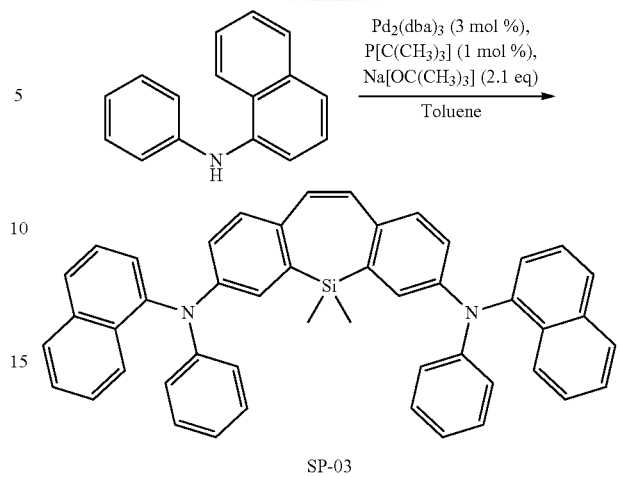

A preparation method of the dibenzoheterocyclic compound shown in the formula SP-03 includes the following steps:

1. Preparation of Intermediate 1-3

In a dry, nitrogen-flushed 500-ml double-neck round-bottom flask, equipped with a magnetic stirring bar and a reflux tube, a compound A-3 (20.548 g, 1.0 equivalent), NBS (N-bromosuccinimide, 19.578 g, 1.1 equivalent), AIBN (azodiisobutyronitrile, 0.821 g, 0.5 mol percent) and carbon tetrachloride (250 ml) were respectively added firstly, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/10) to obtain the intermediate 1-3 (23.604 g, yield: 83%).

2. Preparation of Intermediate 2-3

In a dry, nitrogen-flushed 500-ml double-neck round-bottom flask, equipped with a magnetic stirring bar and a reflux tube, the intermediate 1-3 (20.000 g, 1.0 equivalent), triphenylphosphine (19.369 g, 1.05 equivalent), and toluene (250 ml) were respectively added firstly, the mixture was stirred for 10 minutes, and finally, the mixture was heated refluxly for 18 hours; and after reaction, the mixture was filtered, and then, the obtained solid was cleaned with hexane (3*80 ml) to obtain a crude product (38.316 g) of the intermediate 2-3.

3. Preparation of Intermediate 3-3

In a dry, nitrogen-flushed 500-ml double-neck round-bottom flask, equipped with a magnetic stirring bar, the intermediate 2-3 (35.000 g, 1.0 equivalent), potassium tert-butoxide (21.553 g, 3.0 equivalent), and tetrahydrofuran (150 ml) were respectively added firstly, the mixture was stirred for 10 minutes at 0° C., subsequently, 2-bromo-4-chlorobenzaldehyde (a compound shown in the formula B-3, 14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered, and concentrated under vacuum. The crude product was purified by means of column chromatography (ethyl acetate/hexane, 1/80) to obtain the intermediate 3-3 (24.750 g, yield: 89%).

4. Preparation of Intermediate 4-3

In a dry, nitrogen-flushed 500-ml double-neck round-bottom flask, equipped with a magnetic stirring bar and a reflux tube, the intermediate 3-3 (20.346 g, 1.0 equivalent) and anhydrous tetrahydrofuran (180 ml) were added firstly, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dimethyldichlorosilane (the compound shown in the formula C-1, 6.6 ml, 1.1 equivalent) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-3 (10.531 g, yield: 69%).

5. Preparation of Dibenzoheterocyclic Compound Shown in Formula SP-03

In a dry, nitrogen-flushed 100-ml double-neck round-bottom flask, equipped with a magnetic stirring bar and a reflux tube, the intermediate 4-3 (3.053 g, 1.0 equivalent), N-(1-naphthyl)-aniline (4.495 g, 2.05 equivalent), Pd$_2$(dba)$_3$ (0.275 g, 3 mol percent), potassium tert-butoxide (2.018 g, 2.1 equivalent) and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/25) to obtain the compound SP-03 (6.441 g, yield: 95%).

Elemental analysis: (C$_{48}$H$_{38}$N$_2$Si) theoretical values: C, 85.93; H, 5.71; N, 4.18; Si, 4.19; measured values: C, 85.96; H, 5.72; N, 4.16; Si, 4.16; HRMS (ESI) m/z (M$^+$): theoretical value: 670.9310; measured value: 679.9313.

Embodiment 4

This embodiment provides a dibenzoheterocyclic compound having a structure as shown in the formula SP-04 below:

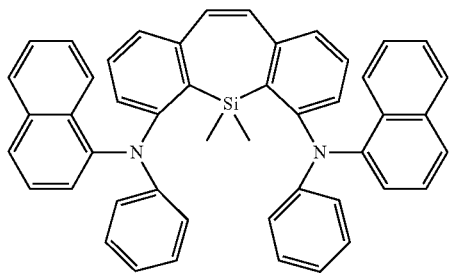

SP-04

A synthesis route of the dibenzoheterocyclic compound shown in the formula SP-04 is as shown below:

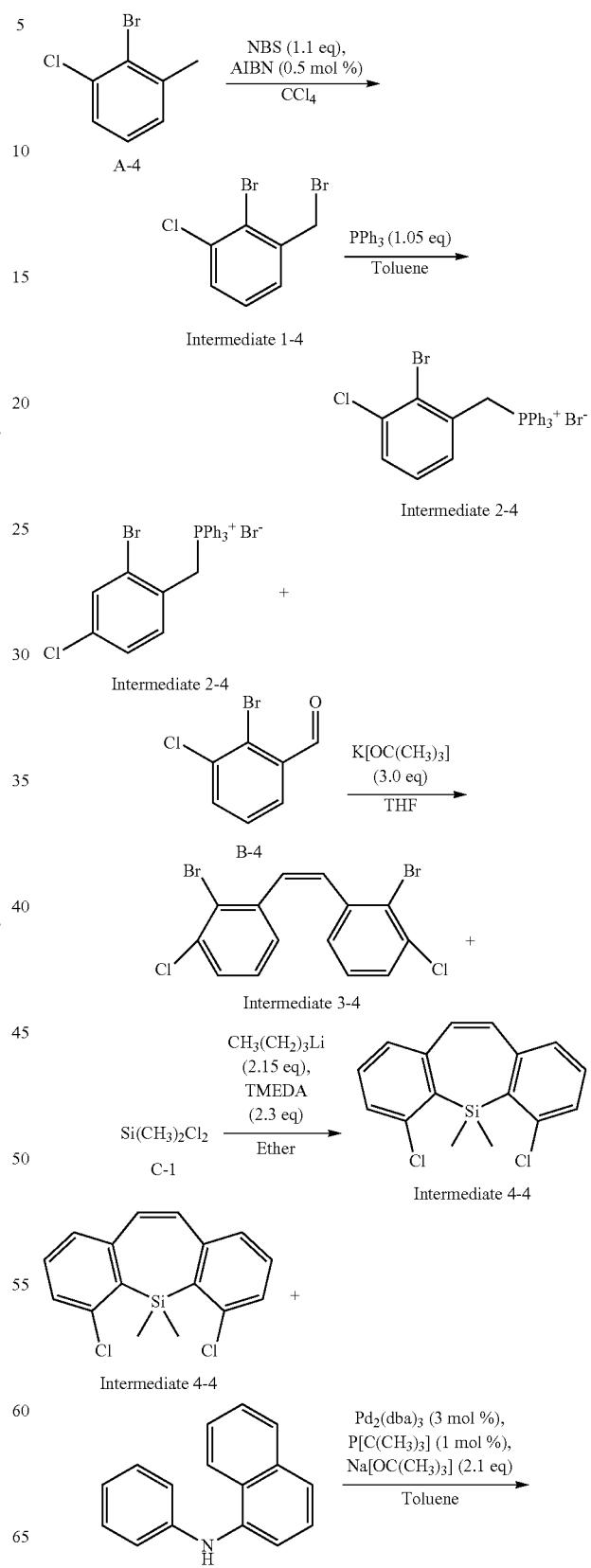

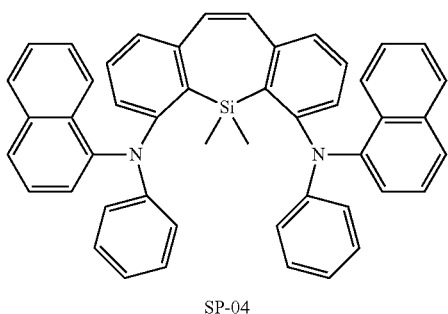 [SMILES: C[Si]1(C)c2c(cccc2N(c2ccccc2)c2cccc3ccccc23)C=Cc2cccc(N(c3ccccc3)c3cccc4ccccc34)c21]

SP-04

A preparation method of the dibenzoheterocyclic compound shown in the formula SP-04 includes the following steps:

1. Preparation of Intermediate 1-4

In a dry, nitrogen-flushed 500-ml double-neck round-bottom flask, equipped with a magnetic stirring bar and a reflux tube, a compound A-4 (20.548 g, 1.0 equivalent), NBS (N-bromosuccinimide, 19.578 g, 1.1 equivalent), AIBN (azodiisobutyronitrile, 0.821 g, 0.5 mol percent), and carbon tetrachloride (250 ml) were respectively added firstly, the mixture was stirred for 10 minutes, and finally, the mixture was heated refluxly for 24 hours; after reaction, water (200 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/10) to obtain the intermediate 1-4 (23.867 g, yield: 65%).

2. Preparation of Intermediate 2-4

In a dry, nitrogen-flushed 500-ml double-neck round-bottom flask, equipped with a magnetic stirring bar and a reflux tube, the intermediate 1-4 (20.000 g, 1.0 equivalent), triphenylphosphine (19.369 g, 1.05 equivalent), and toluene (250 ml) were respectively added firstly, the mixture was stirred for 10 minutes, and finally, the mixture was heated refluxly for 18 hours; and after reaction, the mixture was filtered, and then, the obtained solid was cleaned with hexane (3*80 ml) to obtain a crude product (37.831 g) of the intermediate 2-4.

3. Preparation of Intermediate 3-4

In a dry, nitrogen-flushed 500-ml double-neck round-bottom flask, equipped with a magnetic stirring bar, the intermediate 2-4 (35.000 g, 1.0 equivalent), potassium tert-butoxide (21.553 g, 3.0 equivalent), and tetrahydrofuran (150 ml) were respectively added firstly, the mixture was stirred for 10 minutes at 0° C., subsequently, 2-bromo-3-chlorobenzaldehyde (a compound shown in the formula B-4, 14.051 g, 1.0 equivalent) dissolved in tetrahydrofuran (100 ml) was added dropwise, and finally, the reaction was stirred for 24 hours at room temperature; after reaction, water (50 ml) was added to quench the reaction. After extraction with ethyl ether (3*300 ml), the combined extraction liquids were dried over magnesium sulfate, filtered, and concentrated under vacuum. The crude product was purified by means of column chromatography (ethyl acetate/hexane, 1/75) to obtain the intermediate 3-4 (22.525 g, yield: 81%).

4. Preparation of Intermediate 4-4

In a dry, nitrogen-flushed 500-ml double-neck round-bottom flask, equipped with a magnetic stirring bar and a reflux tube, the intermediate 3-4 (20.346 g, 1.0 equivalent) and anhydrous tetrahydrofuran (180 ml) were added firstly, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dimethyldichlorosilane (the compound shown in the formula C-1, 6.6 ml, 1.1 equivalent) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-4 (7.173 g, yield: 47%).

5. Preparation of Dibenzoheterocyclic Compound Having Structure as Shown in Formula SP-04

In a dry, nitrogen-flushed 100-ml double-neck round-bottom flask, equipped with a magnetic stirring bar and a reflux tube, the intermediate 4-4 (3.053 g, 1.0 equivalent), N-(1-naphthyl)-aniline (4.495 g, 2.05 equivalent), Pd$_2$(dba)$_3$ (0.275 g, 3 mol percent) and potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-04 (5.288 g, yield: 78%).

Elemental analysis: (C$_{48}$H$_{38}$N$_2$Si) theoretical values: C, 85.93; H, 5.71; N, 4.18; Si, 4.19; measured values: C, 85.89; H, 5.75; N, 4.21; Si, 4.15; HRMS (ESI) m/z (M$^+$): theoretical value: 670.9310; measured value: 679.9308.

Embodiment 5

This embodiment provides a dibenzoheterocyclic compound as shown in the formula SP-32 below:

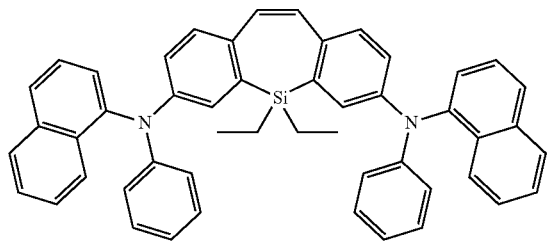

SP-32

A synthesis route of the dibenzoheterocyclic compound shown in the formula SP-32 is as shown below:

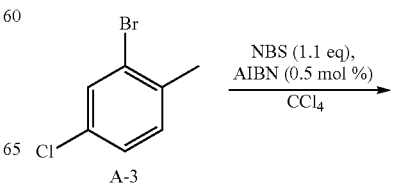

A-3

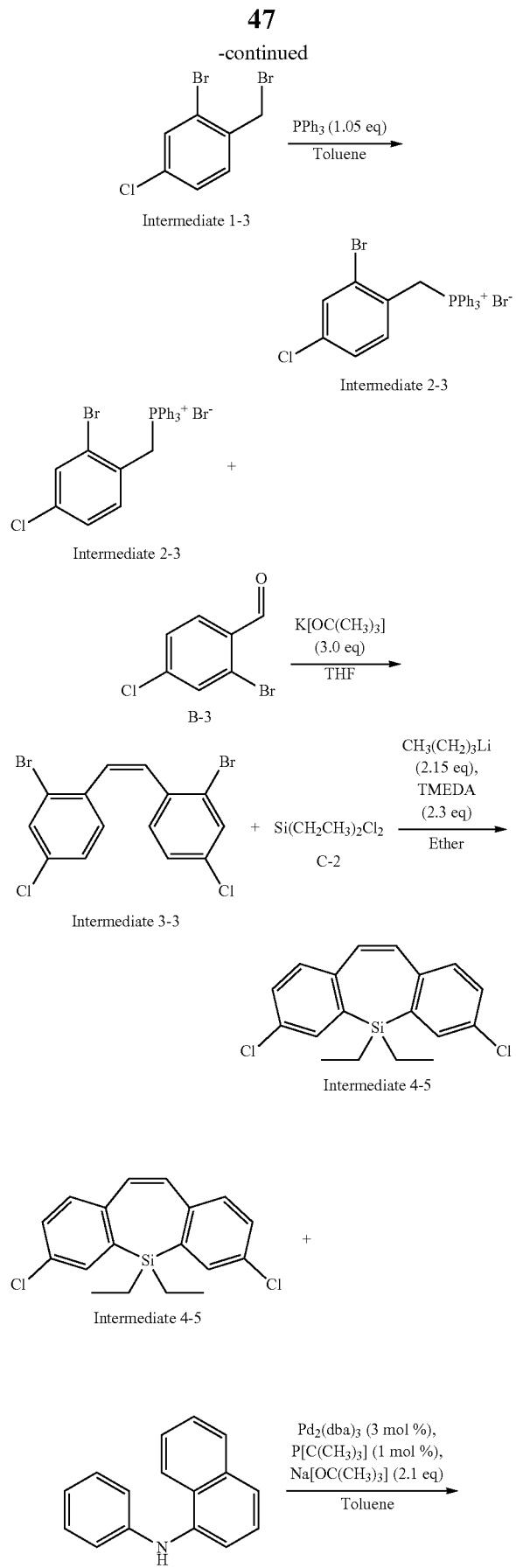
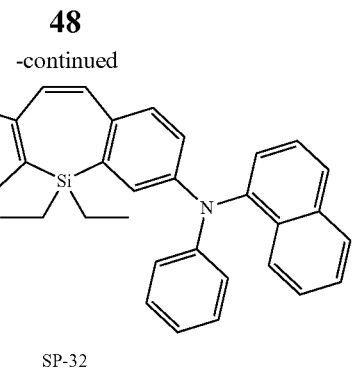

SP-32

A preparation method of the dibenzoheterocyclic compound shown in the formula SP-32 includes the following steps:

1. Preparing an intermediate 3-3 by the method provided by the embodiment 3.

2. Preparing an intermediate 4-5:

In a dry, nitrogen-flushed 500-ml double-neck round-bottom flask, equipped with a magnetic stirring bar and a reflux tube, the intermediate 3-3 (20.346 g, 1.0 equivalent) and anhydrous tetrahydrofuran (180 ml) were added firstly, the mixture was stirred for 10 minutes at −78° C., subsequently, 2.5 M butyl lithium dissolved in hexane (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, diethyldichlorosilane (a compound shown in the formula C-2, 8.2 ml, 1.1 equivalent) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/30) to obtain the intermediate 4-5 (10.333 g, yield: 62%).

3. Preparing the dibenzoheterocyclic compound shown in the formula SP-32:

In a dry, nitrogen-flushed 100-ml double-neck round-bottom flask, equipped with a magnetic stirring bar and a reflux tube, the intermediate 4-5 (3.333 g, 1.0 equivalent), N-(1-naphthyl)-aniline (4.495 g, 2.05 equivalent), $Pd_2(dba)_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-32 (6.774 g, yield: 97%).

Elemental analysis: ($C_{50}H_{42}N_2Si$) theoretical values: C, 85.92; H, 6.06; N, 4.01; Si, 4.02; measured values: C, 85.88; H, 6.07; N, 4.04; Si, 4.01; HRMS (ESI) m/z ($M^+$): theoretical value: 698.3117; measured value: 698.3112.

Embodiment 6

This embodiment provides a dibenzoheterocyclic compound having a structure as shown in the formula SP-34 below:

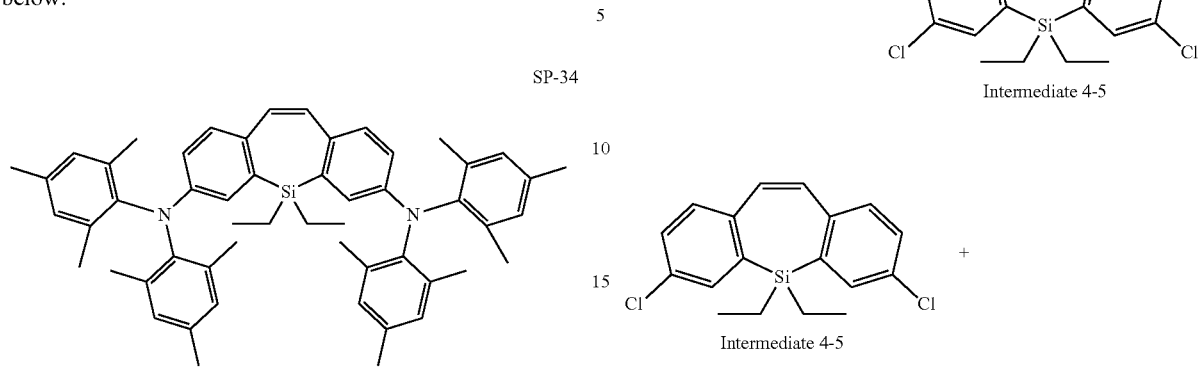

SP-34

A synthesis route of the dibenzoheterocyclic compound shown in the formula SP-34 is as shown below:

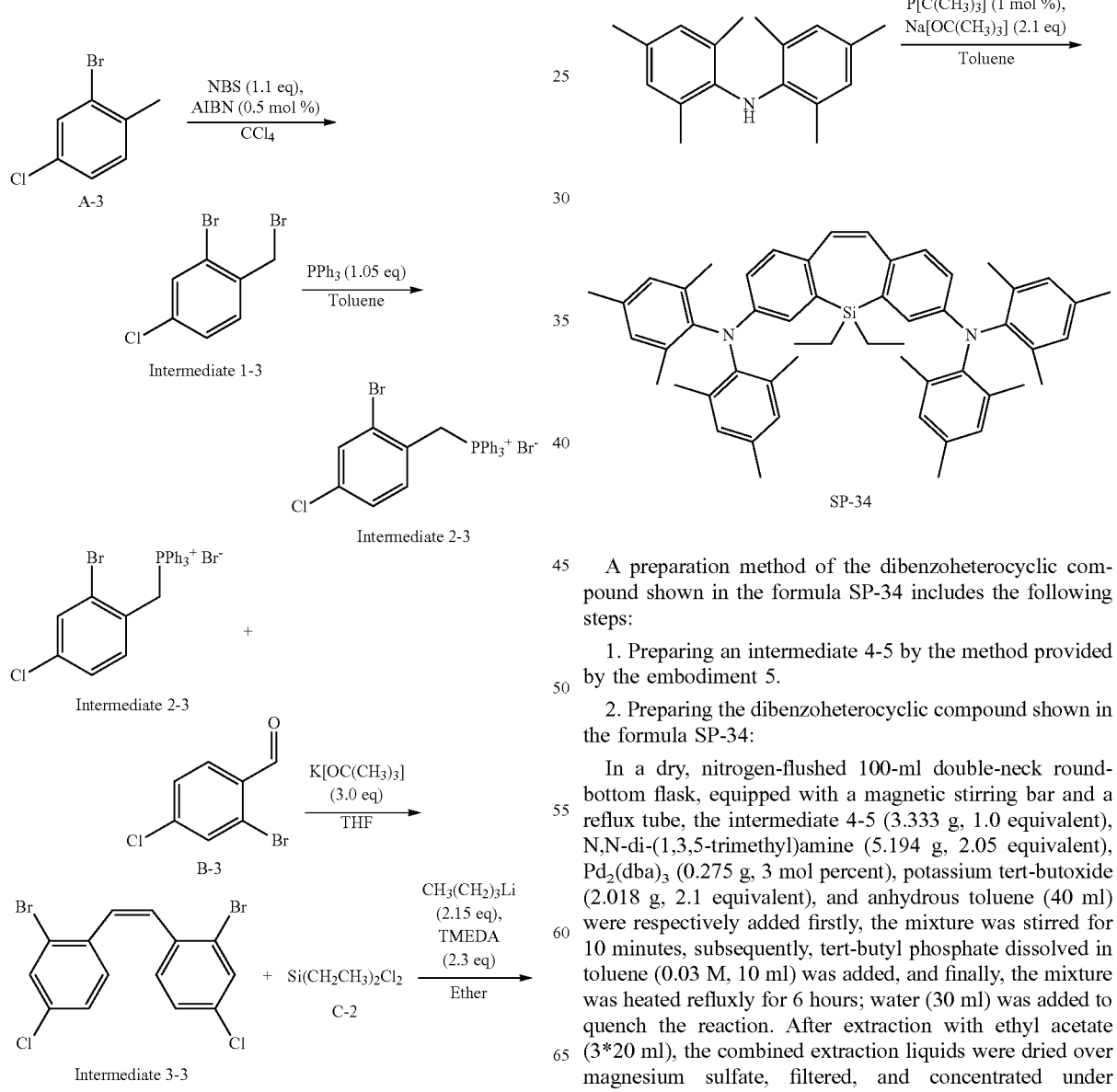

A preparation method of the dibenzoheterocyclic compound shown in the formula SP-34 includes the following steps:

1. Preparing an intermediate 4-5 by the method provided by the embodiment 5.

2. Preparing the dibenzoheterocyclic compound shown in the formula SP-34:

In a dry, nitrogen-flushed 100-ml double-neck round-bottom flask, equipped with a magnetic stirring bar and a reflux tube, the intermediate 4-5 (3.333 g, 1.0 equivalent), N,N-di-(1,3,5-trimethyl)amine (5.194 g, 2.05 equivalent), $Pd_2(dba)_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-34 (6.828 g, yield: 89%).

Elemental analysis: ($C_{54}H_{62}N_2Si$) theoretical values: C, 84.54; H, 8.15; N, 3.65; Si, 3.66; measured values: C, 84.55; H, 8.12; N, 3.69; Si, 3.64; HRMS (ESI) m/z (M+): theoretical value: 767.1890; measured value: 767.1887.

Embodiment 7

This embodiment provides a dibenzoheterocyclic compound having a structure as shown in the formula SP-36 below:

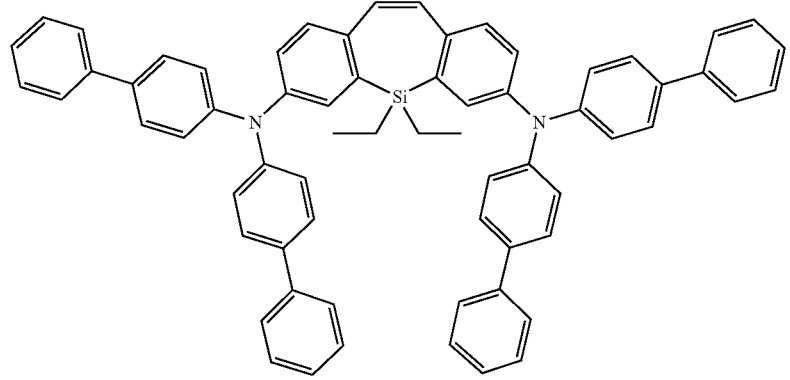

SP-36

A synthesis route of the dibenzoheterocyclic compound shown in the formula SP-36 is as shown below:

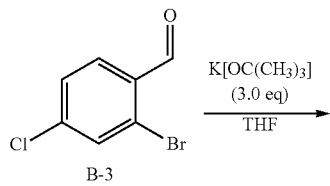

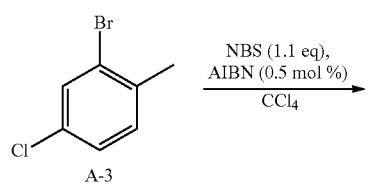

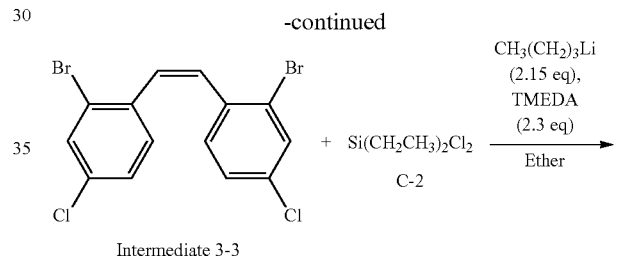

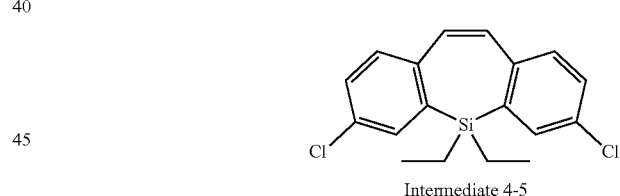

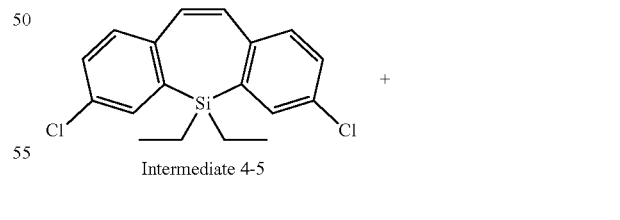

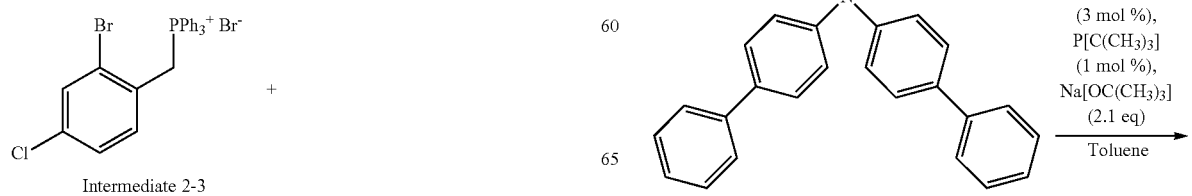

53

-continued

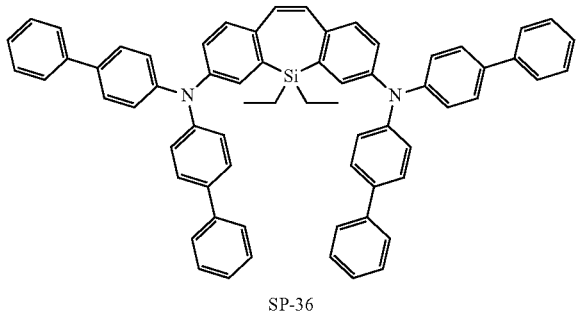 [SMILES: CC[Si]1(CC)c2cc(N(c3ccc(-c4ccccc4)cc3)c3ccc(-c4ccccc4)cc3)ccc2C=Cc2ccc(N(c3ccc(-c4ccccc4)cc3)c3ccc(-c4ccccc4)cc3)cc21 ; "SP-36"]

SP-36

A preparation method of the dibenzoheterocyclic compound shown in the formula SP-36 includes the following steps:

1. Preparing an intermediate 4-5 by the method provided by the embodiment 5.

2. Preparing the dibenzoheterocyclic compound shown in the formula SP-36:

In a dry, nitrogen-flushed 100-ml double-neck round-bottom flask, equipped with a magnetic stirring bar and a reflux tube, the intermediate 4-5 (3.333 g, 1.0 equivalent), N,N-di-(4-biphenyl)amine (6.589 g, 2.05 equivalent), $Pd_2(dba)_3$ (0.275 g, 3 mol percent), potassium tert-butoxide (2.018 g, 2.1 equivalent), and anhydrous toluene (40 ml) were respectively added firstly, the mixture was stirred for 10 minutes, subsequently, tert-butyl phosphate dissolved in toluene (0.03 M, 10 ml) was added, and finally, the mixture was heated refluxly for 6 hours; water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-36 (8.491 g, yield: 94%).

Elemental analysis: ($C_{66}H_{54}N_2Si$) theoretical values: C, 87.76; H, 6.03; N, 3.10; Si, 3.11; measured values: C, 87.71; H, 6.04; N, 3.09; Si, 3.16; HRMS (ESI) m/z ($M^+$): theoretical value: 903.2570; measured value: 903.2566.

Embodiment 8

This embodiment provides a dibenzoheterocyclic compound having a structure as shown in the formula SP-38 below:

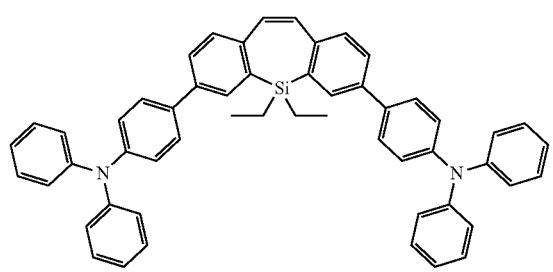

SP-38

54

A synthesis route of the dibenzoheterocyclic compound shown in the formula SP-38 is as shown below:

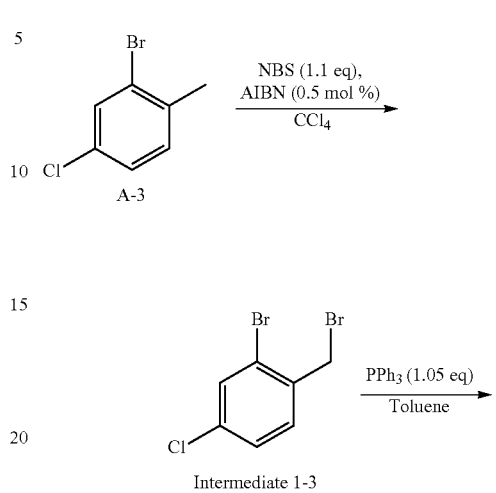

Intermediate 1-3

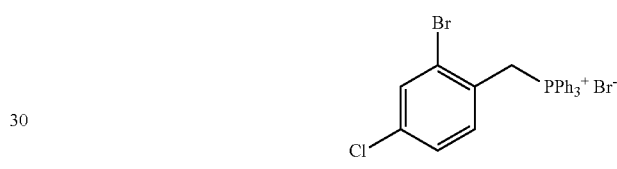

Intermediate 2-3

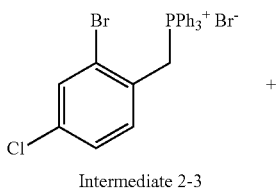

Intermediate 2-3

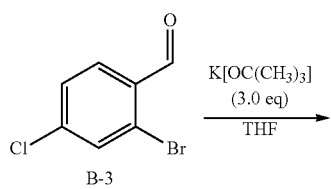

B-3

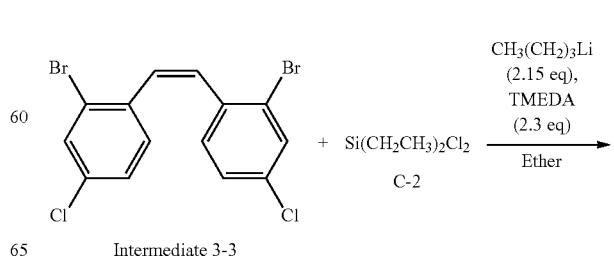

Intermediate 3-3

55

-continued

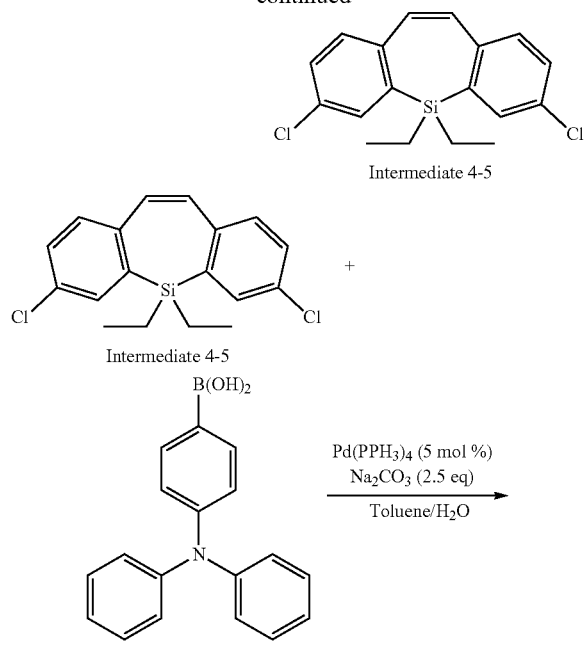

Intermediate 4-5

SP-38

A preparation method of the dibenzoheterocyclic compound shown in the formula SP-38 includes the following steps:

1. Preparing an intermediate 4-5 by the method provided by the embodiment 5.

2. Preparing the dibenzoheterocyclic compound shown in the formula SP-38:

In a dry, nitrogen-flushed 100-ml double-neck round-bottom flask, equipped with a magnetic stirring bar and a reflux tube, the intermediate 4-5 (3.333 g, 1.0 equivalent), 4-(N,N-diphenylamino)phenylboric acid (6.650 g, 2.3 equivalent), Pd(PPh$_3$)$_4$ (0.578 g, 5 mol percent), sodium carbonate (2.649 g, 2.5 equivalent), anhydrous toluene (40 ml) and water (4 ml) were respectively added firstly, the mixture was stirred for 10 minutes, and finally, the mixture was heated refluxly for 18 hours; water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-38 (5.858 g, yield: 78%).

Elemental analysis: (C$_{54}$H$_{46}$N$_2$Si) theoretical values: C, 86.36; H, 6.17; N, 3.73; Si, 3.74; measured values: C, 86.39; H, 6.18; N, 3.71; Si, 3.72; HRMS (ESI) m/z (M$^+$): theoretical value: 751.0610; measured value: 751.0613.

56

Embodiment 9

This embodiment provides a dibenzoheterocyclic compound having a structure as shown in the formula SP-55 below:

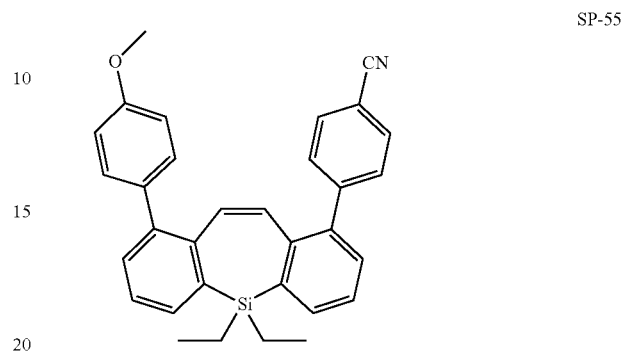

SP-55

A synthesis route of the dibenzoheterocyclic compound shown in the formula SP-55 is as shown below:

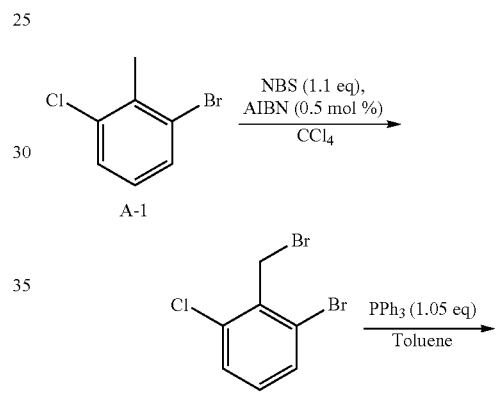

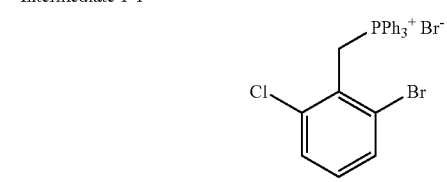

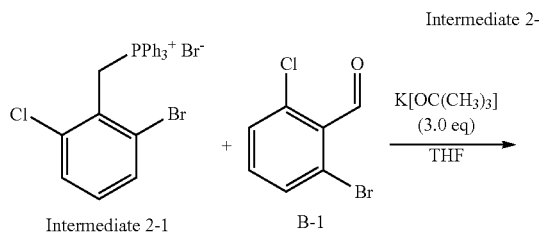

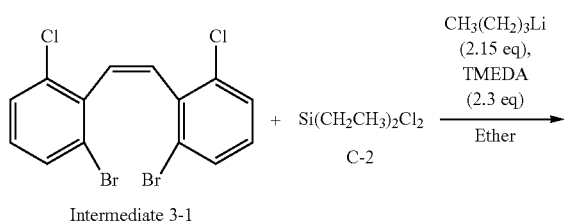

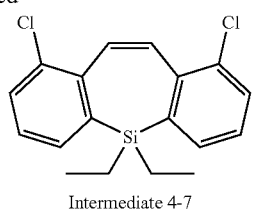
Intermediate 4-7

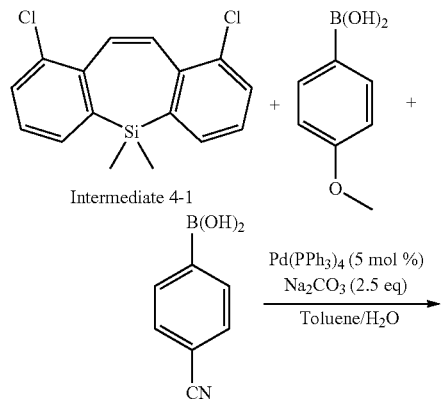

Pd(PPh₃)₄ (5 mol %)
Na₂CO₃ (2.5 eq)
────────────────→
Toluene/H₂O

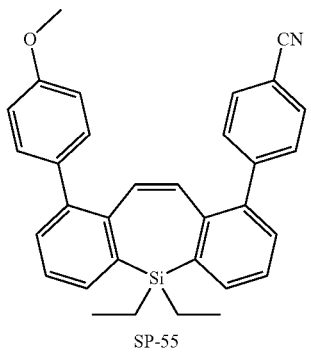
SP-55

A preparation method of the dibenzoheterocyclic compound shown in the formula SP-55 includes the following steps:

1. Preparing an intermediate 4-7 by the method provided by the embodiment 5.

2. Preparing the dibenzoheterocyclic compound shown in the formula SP-55:

In a dry, nitrogen-flushed 100-ml double-neck round-bottom flask, equipped with a magnetic stirring bar and a reflux tube, the intermediate 4-5 (3.333 g, 1.0 equivalent), 4-methoxyphenylboric acid (1.520 g, 1.0 equivalent), Pd(PPh₃)₄ (0.578 g, 5 mol percent), sodium carbonate (2.649 g, 2.5 equivalent), anhydrous toluene (40 ml) and water (4 ml) were respectively added firstly, the mixture was stirred for 10 minutes, and finally, the mixture was heated refluxly for 8 hours; 4-cyanophenylboric acid (1.616 g, 1.1 equivalent) was added after the reaction temperature cooled and the mixture was stirred for 10 minutes, and then, the mixture was heated refluxly for 12 hours; after reaction, water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-55 (3.396 g, yield: 72%).

Elemental analysis: (C₃₂H₂₉NOSi) theoretical values: C, 81.49; H, 6.20; N, 2.97; O, 3.39; Si, 5.95; m/z: 471.2018 (100.0%), 472.2052 (34.6%), 473.2086 (5.8%), 472.2014 (5.1%), 473.1987 (3.3%), 473.2048 (1.8%), 474.2020 (1.2%); HRMS (ESI) m/z (M⁺): theoretical value: 471.2018; measured value: 471.6750.

Embodiment 10

This embodiment provides a dibenzoheterocyclic compound having a structure as shown in the formula SP-56 below:

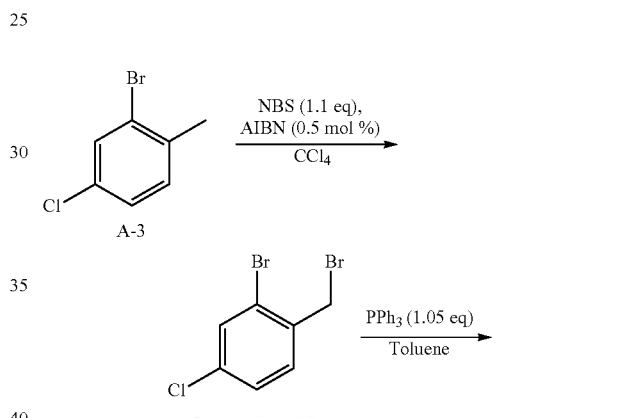
SP-56

A synthesis route of the dibenzoheterocyclic compound shown in the formula SP-56 is as shown below:

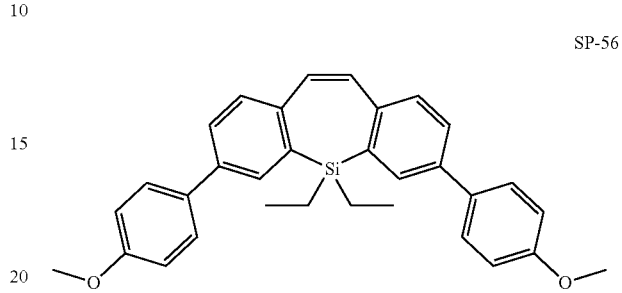

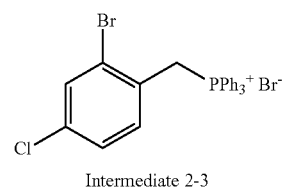
Intermediate 1-3

PPh₃ (1.05 eq)
──────────→
Toluene

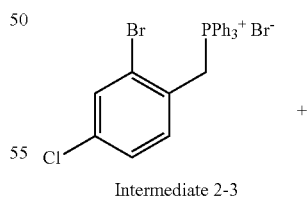
Intermediate 2-3

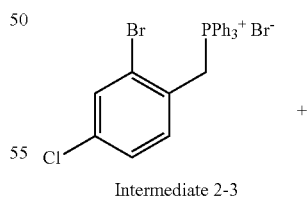
Intermediate 2-3

+

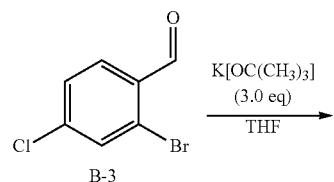
B-3

K[OC(CH₃)₃]
(3.0 eq)
─────────→
THF

-continued

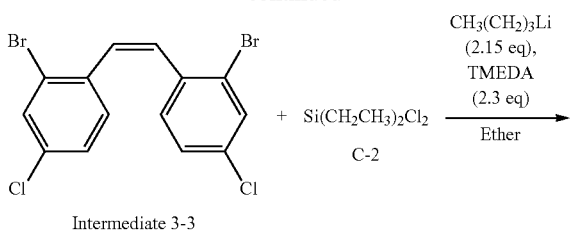

Intermediate 3-3

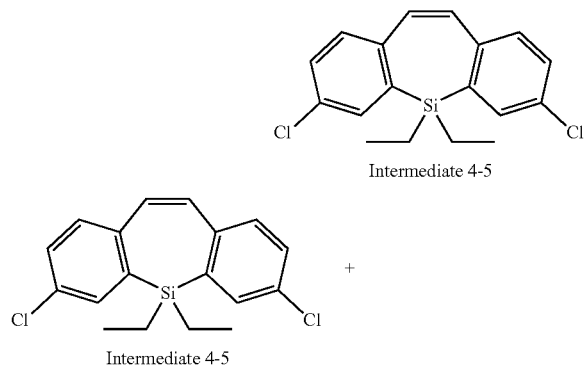

Intermediate 4-5

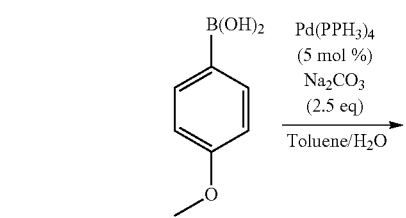

Intermediate 4-5

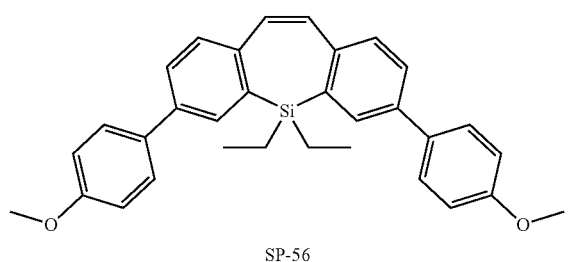

SP-56

A preparation method of the dibenzoheterocyclic compound shown in the formula SP-56 includes the following steps:

1. Preparing an intermediate 4-5 by the method provided by the embodiment 5.
2. Preparing the dibenzoheterocyclic compound shown in the formula SP-56:

In a dry, nitrogen-flushed 100-ml double-neck round-bottom flask, equipped with a magnetic stirring bar and a reflux tube, the intermediate 4-5 (3.333 g, 1.0 equivalent), 4-methoxyphenylboric acid (3.495 g, 2.3 equivalent), Pd(PPh$_3$)$_4$ (0.578 g, 5 mol percent), sodium carbonate (2.649 g, 2.5 equivalent), anhydrous toluene (40 ml) and water (4 ml) were respectively added firstly, the mixture was stirred for 10 minutes, and finally, the mixture was heated refluxly for 18 hours; water (30 ml) was added to quench the reaction. After extraction with ethyl acetate (3*20 ml), the combined extraction liquids were dried over magnesium sulfate, filtered, and concentrated under vacuum. The crude product was purified by means of column chromatography (ethyl acetate/hexane, 1/20) to obtain the compound SP-56 (5.858 g, yield: 86%).

Elemental analysis: (C$_{32}$H$_{32}$O$_2$Si) theoretical values: C, 80.63; H, 6.77; 0, 6.71; Si, 5.89; measured values: C, 80.60; H, 6.72; 0, 6.75; Si, 5.93; HRMS (ESI) m/z (M$^+$): theoretical value: 476.6910; measured value: 476.6907.

Embodiment 11

This embodiment provides a dibenzoheterocyclic compound having a structure as shown in the formula SP-42 below:

SP-42

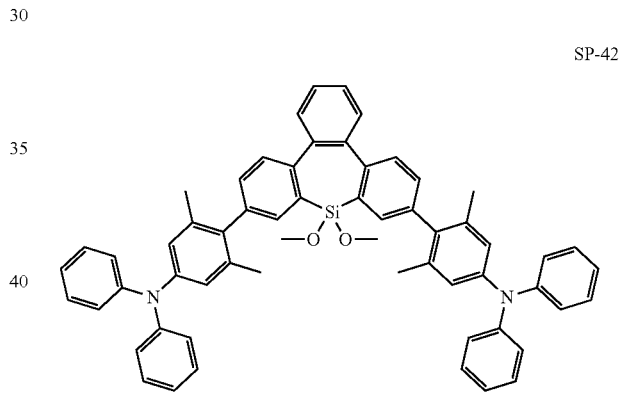

A synthesis route of the dibenzoheterocyclic compound shown in the formula SP-42 is as shown below:

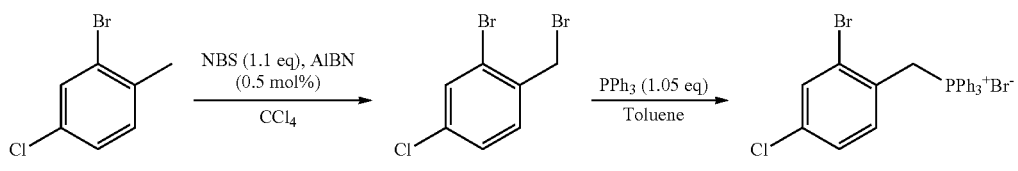

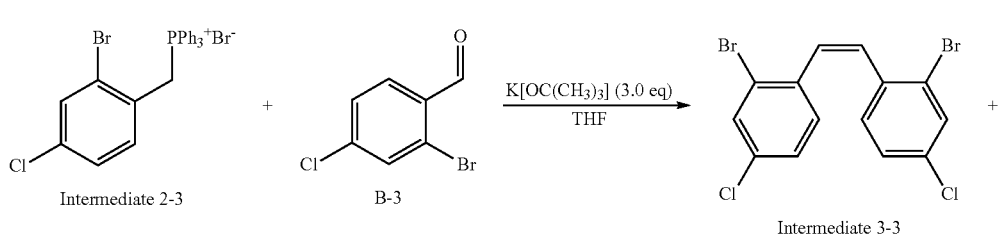

-continued
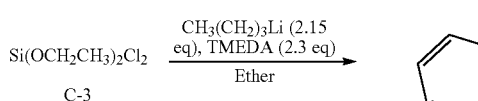
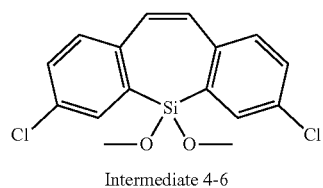
Intermediate 4-6
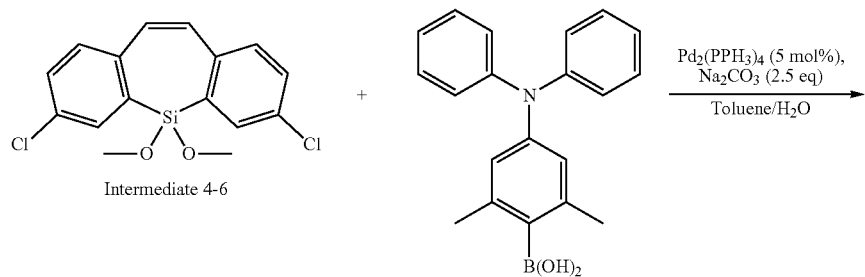
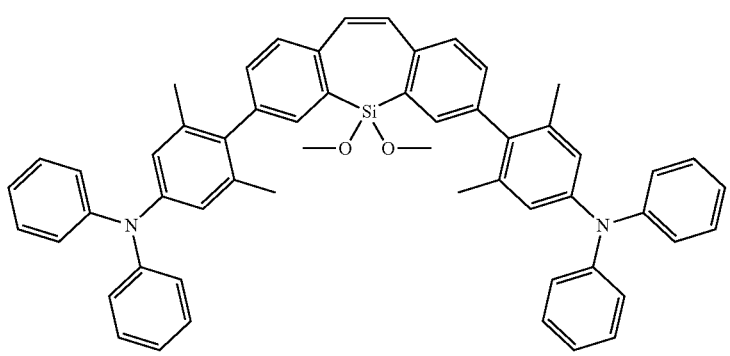
Intermediate I'
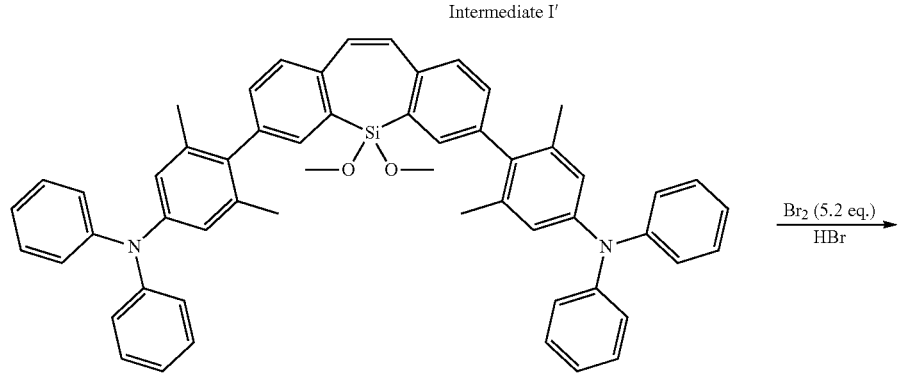
Intermediate I'
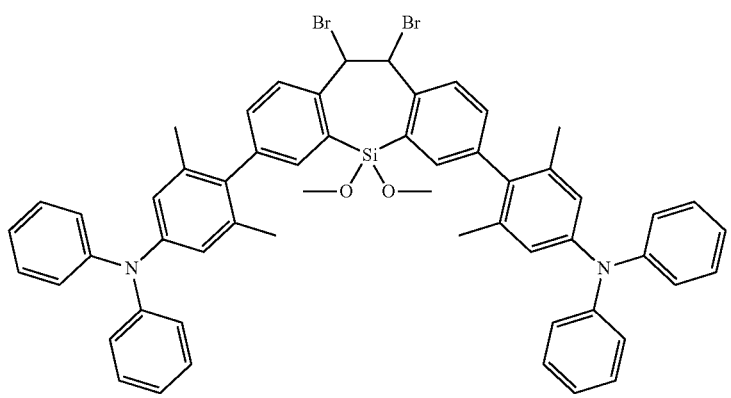
Intermediate I''

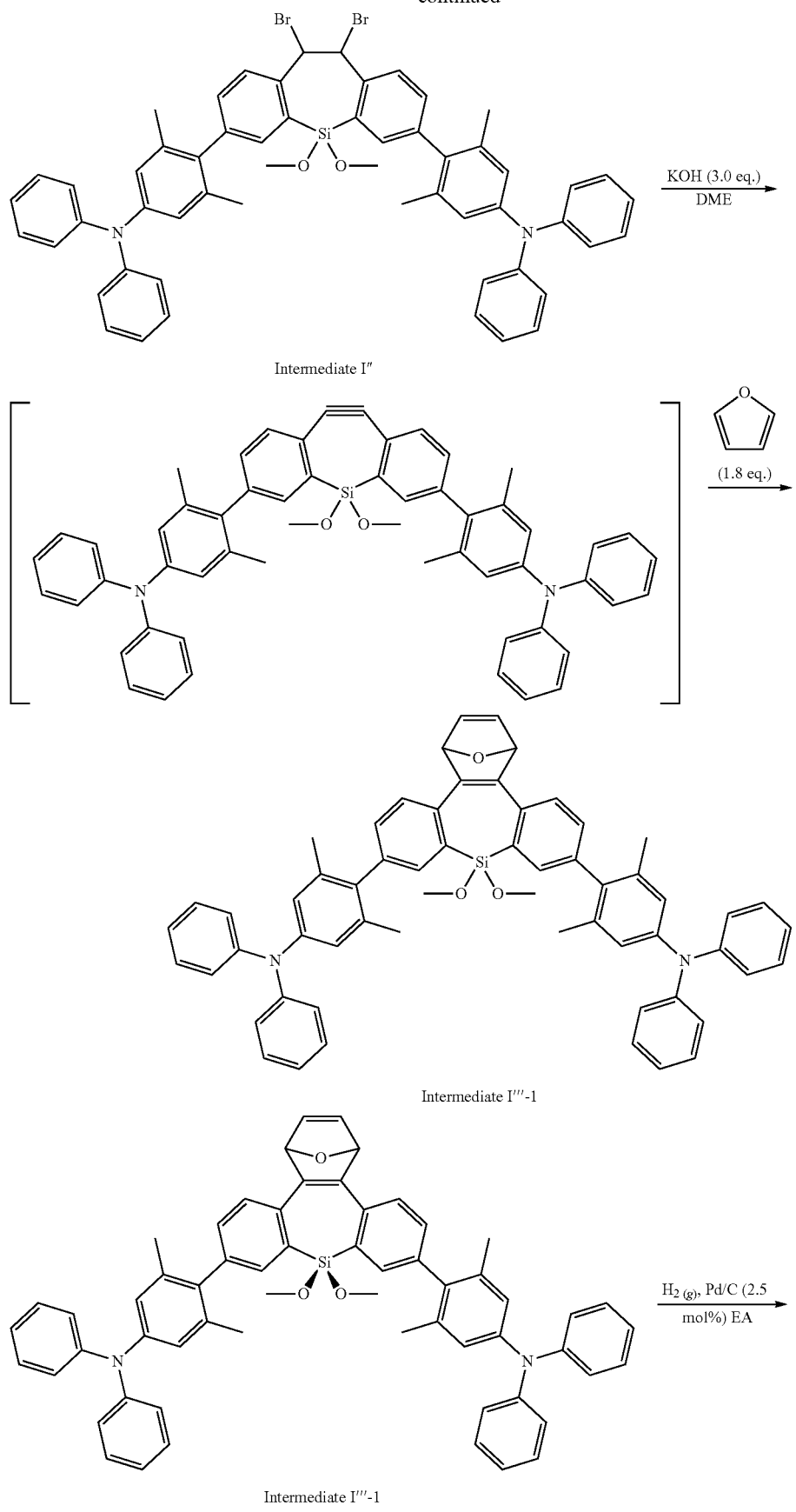

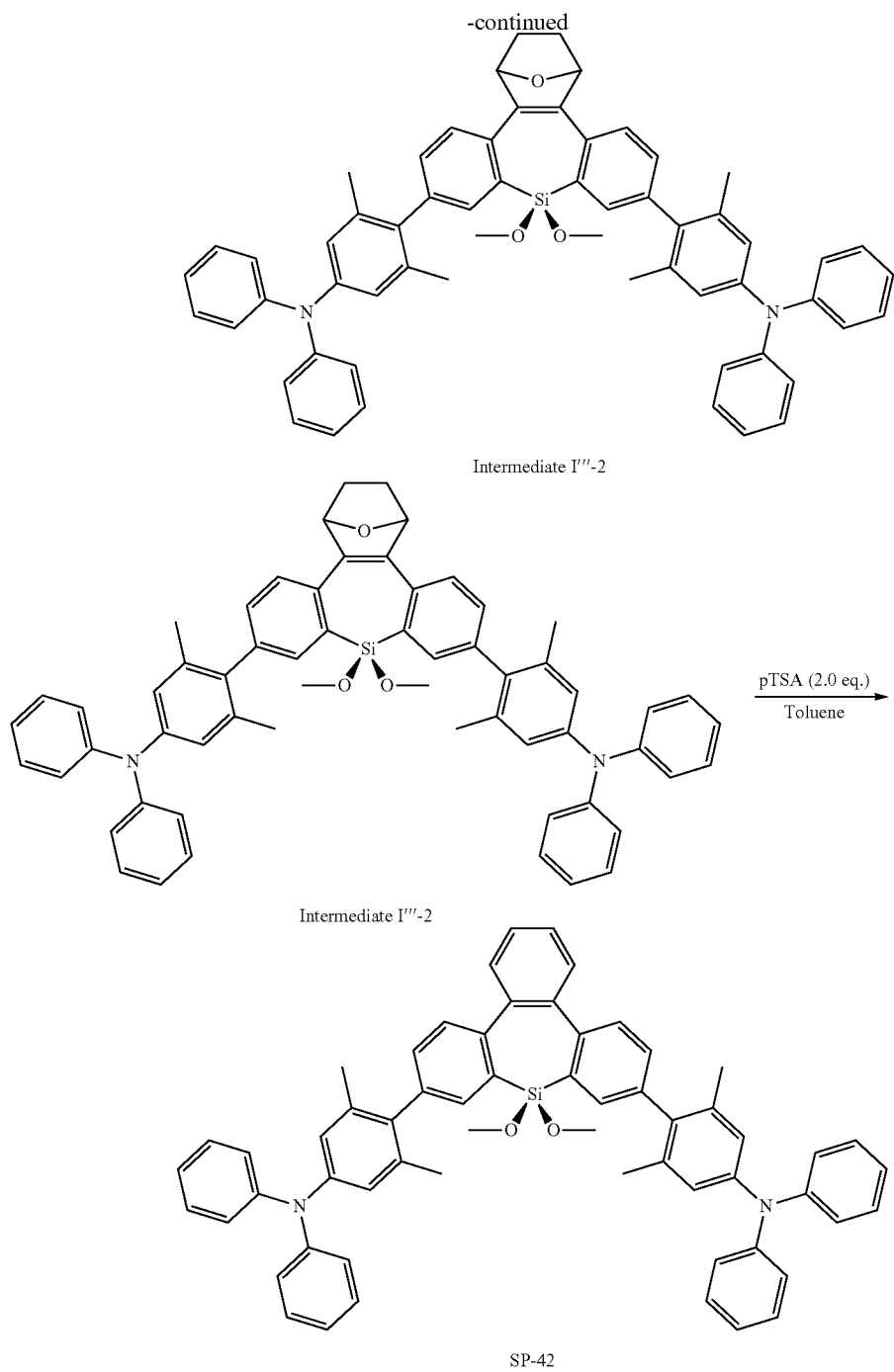

Intermediate I'''-2

Intermediate I'''-2

SP-42

A preparation method of the dibenzoheterocyclic compound shown in the formula SP-56 includes the following steps:

1. Preparing an intermediate 3-3 by the method provided by the embodiment 3.

2. Preparing an intermediate 4-6:

In a dry, nitrogen-flushed 500-ml double-neck round-bottom flask, equipped with a magnetic stirring bar and a reflux tube, the intermediate 3-3 (20.346 g, 1.0 equivalent), and anhydrous tetrahydrofuran (180 ml) were added firstly, the mixture was stirred for 10 minutes at −78° C., subsequently, 2.5 M butyl lithium dissolved in (43 ml, 2.15 equivalent) was added dropwise and the reaction was stirred for 30 minutes, N,N,N',N'-tetramethyl-1,2-ethanediamine (17 ml, 2.3 equivalent) was added dropwise and the reaction was stirred for 2 hours, and finally, dimethoxydichlorosilane (8.858 g, 1.1 equivalent, a compound as shown in the formula C-3) was added dropwise; after reaction, a saturated sodium bicarbonate aqueous solution (50 ml) was added to quench the reaction. After extraction with ethyl acetate (3*150 ml), the combined extraction liquids were dried over magnesium sulfate, filtered, and concentrated under vacuum.

The crude product was purified by means of column chromatography (ethyl acetate/hexane, 1/25) to obtain the intermediate 4-6 (8.600 g, yield: 51%).

3. Preparing an intermediate I':

In a dry, nitrogen-flushed 500-ml double-neck round-bottom flask, equipped with a magnetic stirring bar and a reflux tube, firstly the intermediate 4-6 (8.432 g, 1.0 equivalent), 4-(N,N-diphenylamino)phenylboric acid (18.238 g, 2.3 equivalent), Pd(PPh$_3$)$_4$ (1.444 g, 5 mol percent) and sodium carbonate (6.624 g, 2.5 equivalent), anhydrous toluene (200 ml) and water (20 ml) were respectively added, the mixture was stirred for 10 minutes, and finally, the mixture was heated refluxly for 18 hours; after the reaction was cooing down, water (150 ml) was added to quench the reaction. After extraction with ethyl acetate (3*200 ml), the combined extraction liquids were dried over magnesium sulfate, filtered, and concentrated under vacuum. The crude product was purified by means of column chromatography (ethyl acetate/hexane, 1/20) to obtain the intermediate I' (15.817 g, yield: 78%).

4. Preparing an intermediate I":

In a dry, nitrogen-flushed 500-ml double-neck round-bottom flask, equipped with a magnetic stirring bar and a reflux tube, the intermediate I' (6.071 g, 1.0 equivalent) was added firstly, subsequently, bromine water (2.4 ml, 5.2 equivalent) and hydrobromic acid (150 ml) were respectively added, the mixture was stirred for 10 minutes, and finally, the mixture was heated refluxly for 6 hours; water (120 ml) was added to quench the reaction. After extraction with ethyl acetate (3*150 ml), the combined extraction liquids were dried over magnesium sulfate, filtered, and concentrated under vacuum. The crude product was purified by means of column chromatography (ethyl acetate/hexane, 1/20) to obtain the intermediate I" (11.010 g, yield: 63%).

5. Preparing an intermediate I'''-1:

In a dry, nitrogen-flushed 250-ml double-neck round-bottom flask, equipped with a magnetic stirring bar and a reflux tube, the intermediate I" (9.709 g, 1.0 equivalent), potassium hydroxide (1.683 g, 3.0 equivalent), and 1,2-dimethoxyethane (100 ml) were respectively added firstly, the mixture was stirred for 10 minutes, and finally, the mixture was heated refluxly for 4 hours; after reaction, furan (1.3 ml, 1.8 equivalent) was added, and then, the mixture was heated refluxly for 12 hours; after reaction, water (50 ml) was added to quench the reaction. After extraction with ethyl acetate (3*80 ml), the combined extraction liquids were dried over magnesium sulfate, filtered, and concentrated under vacuum. The crude product was purified by means of column chromatography (ethyl acetate/hexane, 1/25) to obtain the intermediate I'''-1 (4.386 g, yield: 50%).

6. Preparing an intermediate I'''-2:

In a dry, nitrogen-flushed 100-ml double-neck round-bottom flask, equipped with a magnetic stirring bar, the intermediate I'''-1 (3.509 g, 1.0 equivalent), activated carbon supported palladium (5%, 0.213 g, 2.5 mol percent), and ethyl acetate (40 ml) were respectively added firstly, the mixture was stirred for 10 minutes, and finally, hydrogen gas was added and the reaction was stirred for 8 hours at room temperature; water (30 ml) was added. After extraction with ethyl acetate (3*30 ml), the combined extraction liquids were dried over magnesium sulfate, filtered, and concentrated under vacuum. The crude product was purified by means of column chromatography (ethyl acetate/hexane, 1/25) to obtain the intermediate I'''-2 (3.306 g, yield: 94%).

7. Preparing the dibenzoheterocyclic compound shown in the formula SP-42:

In a dry, nitrogen-flushed 50-ml double-neck round-bottom flask, equipped with a magnetic stirring bar and a reflux tube, the intermediate I'''-2 (2.638 g, 1.0 equivalent), p-toluenesulfonic acid (1.033 g, 2.0 equivalent) and toluene (25 ml) were respectively added firstly, the mixture was stirred for 10 minutes, and finally, the mixture was heated refluxly for 16 hours; water (15 ml) was added. After extraction with ethyl acetate (3*20 ml), the combined extraction liquids were dried over magnesium sulfate, filtered, and concentrated under vacuum. The crude product was purified by means of column chromatography (ethyl acetate/hexane, 1/30) to obtain the compound SP-42 (2.506 g, yield: 97%).

Elemental analysis: (C$_{60}$H$_{52}$N$_2$O$_2$Si) theoretical values: C, 83.68; H, 6.09; N, 3.25; measured values: C, 83.66; H, 6.10; N, 3.28; HRMS (ESI) m/z (M$^+$): theoretical value: 860.3798; measured value: 860.3792.

Embodiment 12

This embodiment provides an organic light-emitting device. As shown in FIG. 1, the organic light-emitting device includes an anode 1, a hole injection layer 2, a hole transport layer 3, a light-emitting layer 4, an electron transport layer 5, an electron injection layer 6 and a cathode 7 which are sequentially stacked on a substrate.

In the organic light-emitting device, the anode is made of an ITO material; the cathode 7 is made of metal Al;

the hole injection layer 2 is made from PEDOT:PSS, and the PEDOT:PSS has a chemical structure as shown below:

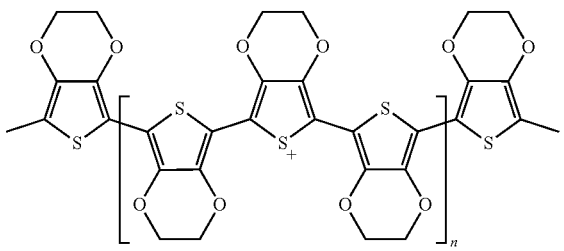

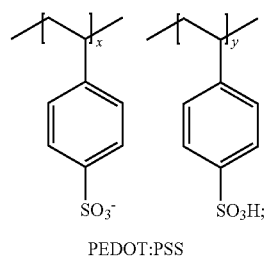

PEDOT:PSS the hole transport layer 3 is made from NPB, and the NPB has a chemical structure as shown below:

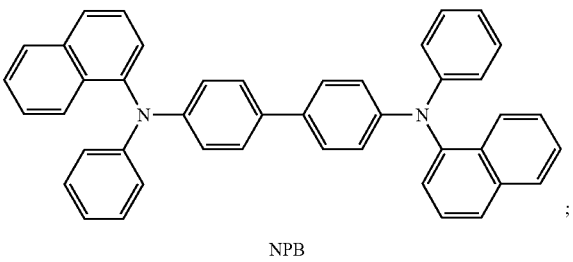 [SMILES: c1ccc(N(c2ccc(-c3ccc(N(c4ccccc4)c4cccc5ccccc45)cc3)cc2)c2cccc3ccccc23)cc1 ; "NPB"]

NPB the electron transport layer 5 is made from TPBI, and the TPBI has the chemical structure as shown below:

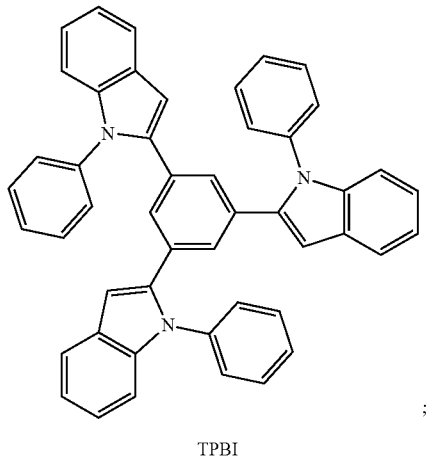

TPBI

;

the electron injection layer 6 is formed by doping TPBI with an electron injection material LiF;

a light-emitting material of the light-emitting layer 32 in the organic light emitting diode is selected from the dibenzoheterocyclic compound shown in the formula SP-01:

SP-01

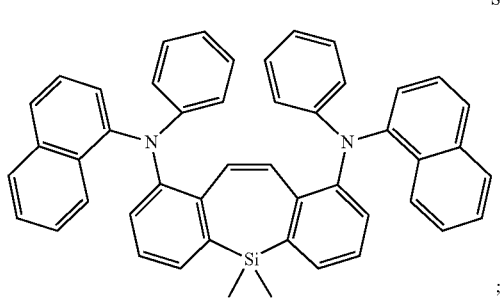

;

and the organic light-emitting device forms the following specific structure: ITO (anode)/PEDOT:PSS (hole injection layer, 30 nm)/NPB (hole transport layer, 40 nm)/SP-01 (blue light-emitting layer, 40 nm)/TPBI (electron injection layer, 35 nm)/TPBI:LiF (electron transport layer, 40 nm) aluminum (cathode, 5 nm/150 nm).

The light-emitting layer material is selected from the dibenzoheterocyclic compound SP-01, light color coordinates are positioned in a blue light-emitting region, and a blue light-emitting device can be obtained. Because of the existence of the diphenylethylene group in the mother nucleus structure, the compound SP-01 has a low LUMO energy level (−1.35 eV), thereby being favorable for matching the energy level of the electron transport layer, and promoting injection and transport of electrons. Meanwhile, the dibenzoheterocyclic compound SP-01 is linked with the substituent group

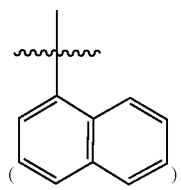 [SMILES: *c1cccc2ccccc12]

of an electron donor, material molecules have good hole transport performance, and the HOMO energy level is suitable for matching an adjacent hole transport layer, thereby being favorable for balancing electrons and holes in the light-emitting layer, increasing the combination probability of electrons and holes, and improving the blue light-emitting efficiency of the OLED. The spatial configuration of the dibenzoheterocyclic compound SP-01 is a butterfly configuration, thereby avoiding the generation of high energy excitons caused by stacking of the material molecules, effectively reducing the annihilation of the excitons in the light-emitting layer, avoiding the efficiency roll-off of the blue light-emitting device, preventing deep blue color coordinate drift, and further obtaining the blue light-emitting device with high light-emitting stability. Proper HOMO and LUMO energy levels of the dibenzoheterocyclic compound SP-01 are favorable for lowering the potential barrier needing to be overcome by transporting electrons and holes to the light-emitting layer, and further lowering the working voltage of the device. On the other hand, the dibenzoheterocyclic compound shown in SP-01 has high thermal decomposition temperature, high thermal stability and morphological stability and excellent film formation performance; and as a light-emitting layer material, the compound is not easy to decompose and crystallize, thereby further improving the performance and the light-emitting efficiency of the OLED.

As an alternative embodiment, the guest light-emitting material of the light-emitting layer can also be selected from any dibenzoheterocyclic compound shown in the formula (SP-02) to the formula (SP-65).

As an alternative embodiment, the guest light-emitting material of the light-emitting layer can also be selected from any other dibenzoheterocyclic compound having a chemical structure shown in the general formula (I).

Embodiment 13

This embodiment provides an organic light-emitting device, which is different from the organic light-emitting device provided by the embodiment 12 only in that the light-emitting layer material is selected from the dibenzoheterocyclic compound having a structure shown below:

SP-03

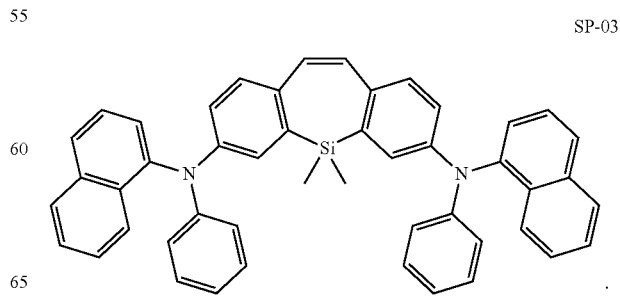

Embodiment 14

This embodiment provides an organic light-emitting device, which is different from the organic light-emitting device provided by the embodiment 12 only in that the light-emitting layer material is selected from the dibenzoheterocyclic compound having a structure shown below:

SP-04

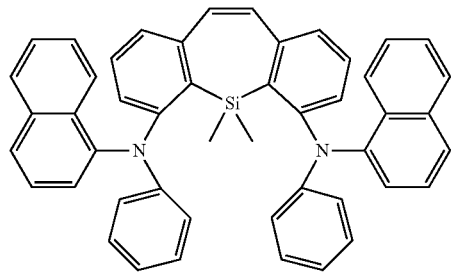

Embodiment 15

This embodiment provides an organic light-emitting device, which is different from the organic light-emitting device provided by the embodiment 12 only in that the light-emitting layer material is selected from the dibenzoheterocyclic compound having a structure shown below:

SP-32

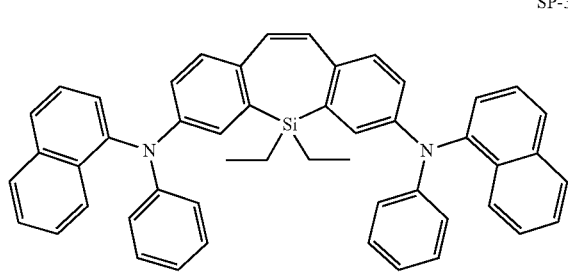

Embodiment 16

This embodiment provides an organic light-emitting device, which is different from the organic light-emitting device provided by the embodiment 12 only in that the light-emitting layer material is selected from the dibenzoheterocyclic compound having a structure shown below:

SP-34

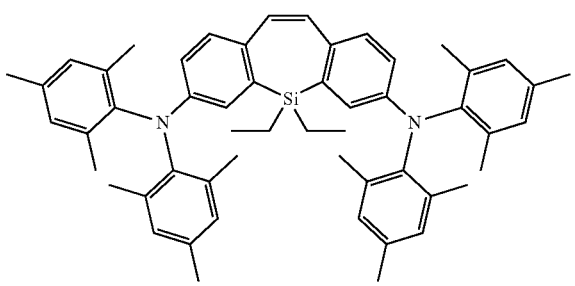

Embodiment 17

This embodiment provides an organic light-emitting device, which is different from the organic light-emitting device provided by the embodiment 12 only in that the light-emitting layer material is selected from the dibenzoheterocyclic compound having a structure shown below:

SP-42

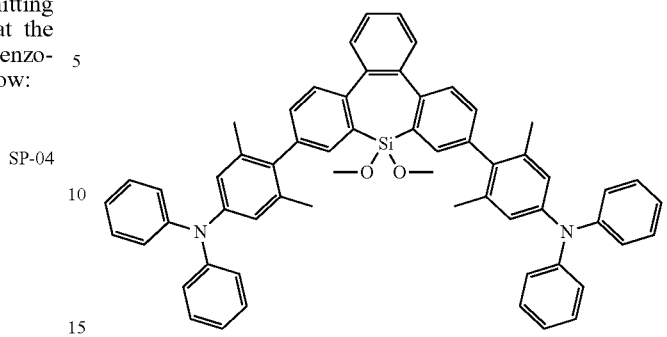

Embodiment 18

This embodiment provides an organic light-emitting device, which is different from the organic light-emitting device provided by the embodiment 12 only in that the light-emitting layer material is selected from the dibenzoheterocyclic compound having a structure shown below:

SP-55

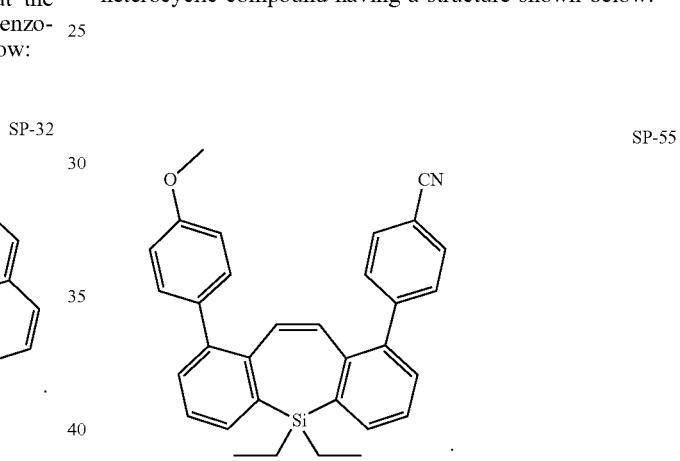

Embodiment 19

This embodiment provides an organic light-emitting device, which is different from the organic light-emitting device provided by the embodiment 12 in that the light-emitting layer material is selected from the dibenzoheterocyclic compound having a structure shown below:

SP-56

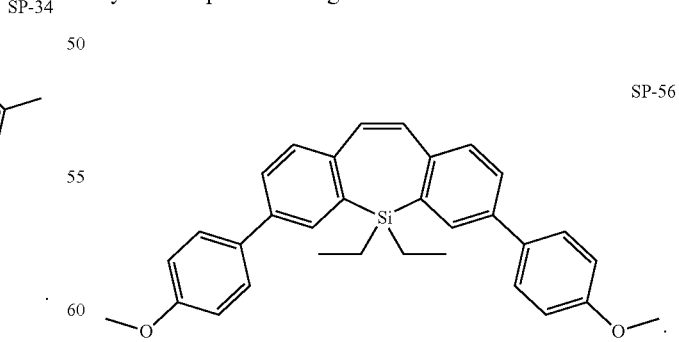

Contrast 1

This contrast provides an organic light-emitting device, which is different from the organic light-emitting device provided by the embodiment 12 only in that the light-emitting layer material is selected from the compound having a structure shown below:

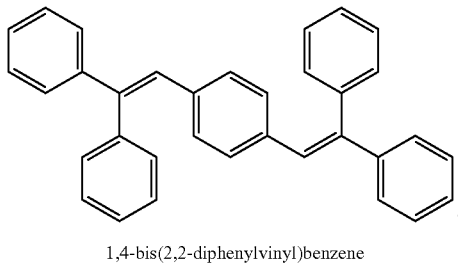

1,4-bis(2,2-diphenylvinyl)benzene

Test Case 1

1. Measurement of Thermal Decomposition Temperature ($T_d$) of Dibenzoheterocyclic Compound A thermal gravimetric analyzer (TGA) is used for testing the thermal decomposition temperature of the material of the invention in the range from room temperature to 600° C. at a ramping rate of 10° C./min under nitrogen atmosphere, the temperature with the weight loss of 0.5% is defined as the thermal decomposition temperature.

2. Measurement of HOMO Energy Level and LUMO Energy Level of Dibenzoheterocyclic Compound An electrochemical workstation is used for testing the HOMO and LUMO energy levels of the material of the invention through a cyclic voltammetry (CV), a platinum filament (PT) is used as a counter electrode, and silver/silver chloride (Ag/AgCl) is used as a reference electrode. Under the nitrogen atmosphere, a test is carried out in a dichloromethane electrolyte containing 0.1 M tetrabutylammonium hexafluorophosphate at a scanning rate of 100 mV/s, potential calibration is performed by ferrocene, and an absolute HOMO energy level of the potential of the ferrocene in a vacuum state is set to −4.8 eV:

$HOMO = -[E_{onset}^{ox} - E_{Fc/Fc+} + 4.8]eV;$ $LUMO = -[E_{onset}^{red} - E_{Fc/Fc+} + 4.8]eV.$ Test Case 2

The properties, such as current, voltage, brightness and luminescent spectrum, of the organic light emitting diode provided by the embodiment 12 to the embodiment 19 and the contrast 1 are synchronously tested by adopting a PR 650 spectral scanning brightness meter and a Keithley K 2400 digital source meter system. Test results are as shown in table 2.

TABLE 2

|  | Dibenzo-heterocyclic compound | Voltage/V | Current density/mA/cm² | Current efficiency/cd/A | Chroma/CIE (X, Y) |
| --- | --- | --- | --- | --- | --- |
| Contrast 1 |  | 7.8 | 20 | 4.8 | (0.15, 0.24) |
| Embodiment 12 | SP-01 | 4.7 | 20 | 17 | (0.14, 0.23) |
| Embodiment 13 | SP-03 | 4.6 | 20 | 21 | (0.15, 0.25) |
| Embodiment 14 | SP-04 | 4.5 | 20 | 21 | (0.15, 0.25) |
| Embodiment 15 | SP-32 | 4.8 | 20 | 20 | (0.16, 0.21) |
| Embodiment 16 | SP-34 | 4.5 | 20 | 18 | (0.16, 0.28) |
| Embodiment 17 | SP-42 | 4.7 | 20 | 19 | (0.15, 0.14) |
| Embodiment 18 | SP-55 | 4.6 | 20 | 20 | (0.15, 0.12) |
| Embodiment 19 | SP-56 | 4.9 | 20 | 19 | (0.15, 0.11) |

According to the table 2, as a light-emitting layer material, the dibenzoheterocyclic compound provided by the invention is favorable for lowering the driving voltages of the device and improving the light-emitting efficiency of the device, and a deep blue light-emitting device with high luminescence efficiency and stable performance can be obtained.

Apparently, the above-described embodiments are merely examples provided for clarity of description, and are not intended to limit the implementations of the invention. Other variations or changes can be made by those skilled in the art based on the above description. The embodiments are not exhaustive herein. Obvious variations or changes derived therefrom also fall within the protection scope of the invention.

TABLE 1

| Compound | SP-01 | SP-02 | SP-03 | SP-04 | SP-32 | SP-34 | SP-36 | SP-38 | SP-42 | SP-55 | SP-56 |
| --- | --- | --- | --- | --- | --- | --- | --- | --- | --- | --- | --- |
| $T_d$ (° C.) | 427 | 436 | 438 | 431 | 441 | 428 | 426 | 423 | 436 | 416 | 427 |
| HOMO (eV) | −4.96 | −4.94 | −4.66 | −4.99 | −4.68 | −4.71 | −4.65 | −4.61 | −4.56 | −4.62 | −4.59 |
| LUMO (eV) | −1.35 | −1.57 | −1.36 | −1.51 | −1.36 | −1.44 | −1.33 | −1.30 | −1.32 | −1.38 | −1.47 |

According to the test data in the table 1, the dibenzoheterocyclic compound provided by the invention has high thermal decomposition temperature and has higher thermal stability after film formation, material molecules are not easy to decompose or crystallize along with heat generated during the use of a device, the functions of a light-emitting layer can be kept stable, the breakdown of the device can be avoided, and the service life of the device can be prolonged. Meanwhile, the dibenzoheterocyclic compound has a low LUMO energy level (−1.30 to −1.57 eV), thereby being favorable for injecting and transporting electrons to the light-emitting layer and increasing the electron ratio. Because the hole transport performance of a semiconductor material is generally higher than the electron transport performance of the semiconductor material, the dibenzoheterocyclic compound is favorable for balancing electrons and holes, and the light-emitting efficiency of the device is improved.

What is claimed is:

1. The dibenzoheterocyclic compound having a structure as shown below:

SP-01

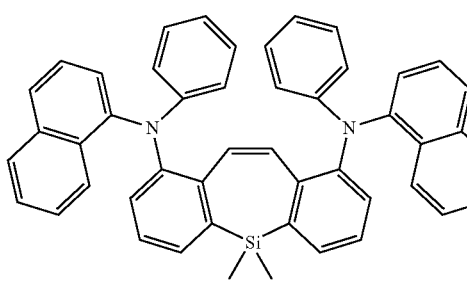

2. A preparation method of the dibenzoheterocyclic compound according to claim 1, wherein synthesis steps of the dibenzoheterocyclic compound shown in the formula (I) are as follows:

taking a compound shown in a formula (A) as a starting material, performing halogenating reaction under the action of a catalyst to obtain an intermediate 1, and enabling the intermediate 1 to react with triphenylphosphine to generate an intermediate 2; enabling the intermediate 2 and a compound shown in a formula (B) to be subjected to Wittig reaction to obtain an intermediate 3; enabling the intermediate 3 and a compound shown in a formula (C) to be subjected to condensation reaction to obtain an intermediate 4; enabling the intermediate 4 to react with a compound of $Y^1$ and $-Y^5$ to generate a compound shown in a formula (I');

wherein $X_1$-$X_3$ are, each independently, selected from halogen, and $R_3$-$R_{10}$ are, each independently, selected from halogen or hydrogen;

a synthesis route of the dibenzoheterocyclic compound shown in the formula (I) is as follows:

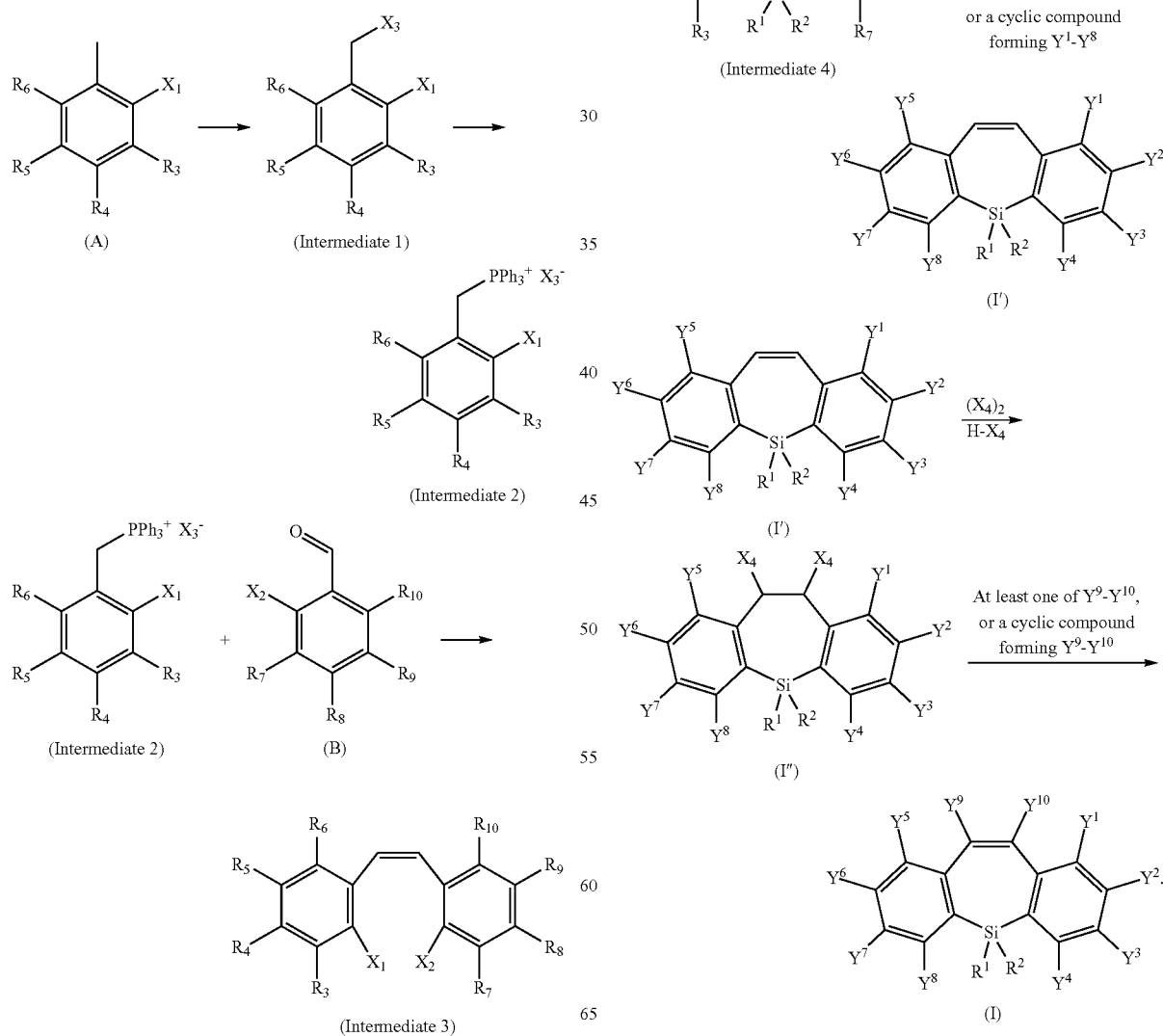

3. The dibenzoheterocyclic compound according to claim 1, wherein the dibenzoheterocyclic compound is an organic electroluminescent material.

4. An organic light emitting diode, wherein at least one functional layer of the organic light emitting diode contains the dibenzoheterocyclic compound according to claim 1.

5. The organic light emitting diode according to claim 4, wherein the functional layer is a light-emitting layer.

6. The organic light emitting diode according to claim 4, wherein a light-emitting layer material comprises a host material and a guest light-emitting dye, and the guest light-emitting material is the dibenzoheterocyclic compound.

7. The organic light emitting diode according to claim 4, wherein the organic light emitting diode is a blue light-emitting device.

8. A display unit, comprising the organic light emitting diode according to claim 4.

* * * * *